(12) United States Patent
Vogelsang et al.

(10) Patent No.: US 9,037,949 B1
(45) Date of Patent: May 19, 2015

(54) ERROR CORRECTION IN A MEMORY DEVICE

(71) Applicant: Rambus Inc., Sunnyvale, CA (US)

(72) Inventors: Thomas Vogelsang, Mountain View, CA (US); Suresh N. Rajan, Fremont, CA (US); Ian P. Shaeffer, Los Gatos, CA (US); Frederick A. Ware, Los Altos Hills, CA (US); Wayne F. Ellis, Saratoga, CA (US)

(73) Assignee: Rambus Inc., Sunnyvale, CA (US)

( * ) Notice: Subject to any disclaimer, the term of this patent is extended or adjusted under 35 U.S.C. 154(b) by 115 days.

(21) Appl. No.: 13/846,200

(22) Filed: Mar. 18, 2013

Related U.S. Application Data

(60) Provisional application No. 61/662,684, filed on Jun. 21, 2012, provisional application No. 61/714,995, filed on Oct. 17, 2012.

(51) Int. Cl.
  *G11C 29/00* (2006.01)
  *G06F 11/10* (2006.01)

(52) U.S. Cl.
  CPC .................................... *G06F 11/10* (2013.01)

(58) Field of Classification Search
  CPC .................................................. H04L 1/0057
  USPC ........ 714/776, 724, 770, 763, 718, 765, 773, 714/769
  See application file for complete search history.

(56) References Cited

U.S. PATENT DOCUMENTS

| | | | |
|---|---|---|---|
| 7,574,648 B2 * | 8/2009 | Akiyama et al. ............... | 714/769 |
| 8,132,086 B2 | 3/2012 | Park et al. | |
| 2008/0168331 A1 * | 7/2008 | Vogelsang et al. ............ | 714/770 |
| 2008/0195894 A1 | 8/2008 | Schreck et al. | |
| 2011/0138251 A1 | 6/2011 | Pawlowski | |

* cited by examiner

*Primary Examiner* — Fritz Alphonse
(74) *Attorney, Agent, or Firm* — Hamilton, Brook, Smith & Reynolds, P.C.

(57) ABSTRACT

A dynamic random access memory (DRAM) array is configured for selective repair and error correction of a subset of the array. Error-correcting code (ECC) is provided to a selected subset of the array to protect a row or partial row of memory cells where one or more weak memory cells are detected. By adding a sense amplifier stripe to the edge of the memory array, the adjacent edge segment of the array is employed to store ECC information associated with the protected subsets of the array. Bit replacement is also applied to defective memory cells. By implementing ECC selectively rather than to the entire array, integrity of the memory array is maintained at minimal cost to the array in terms of area and energy consumption.

23 Claims, 30 Drawing Sheets

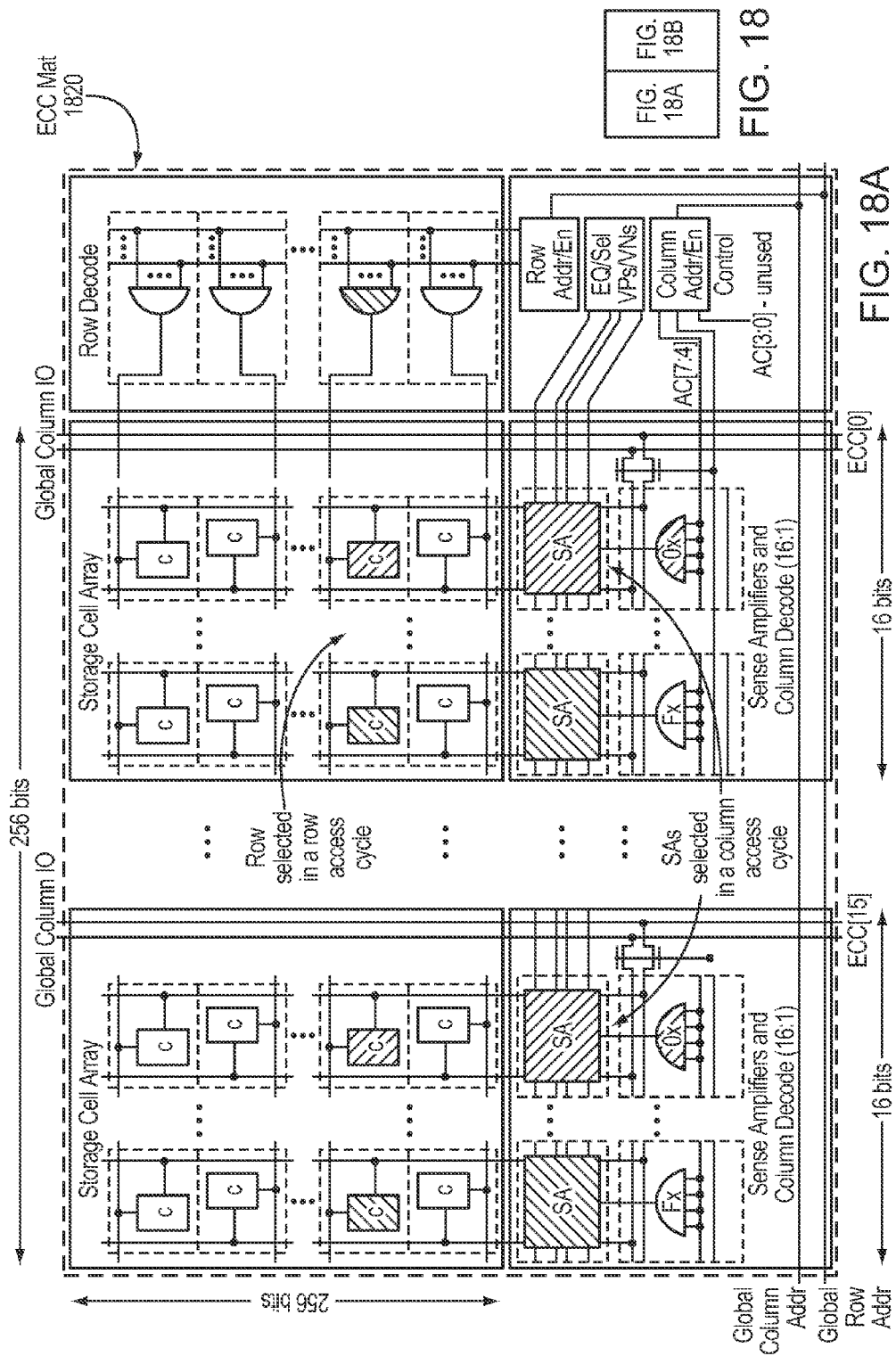

ERROR CORRECTION IN A MEMORY DEVICE

RELATED APPLICATIONS

This Application claims the benefit of U.S. Provisional Application No. 61/662,684, filed Jun. 21, 2012, and U.S. Provisional Application No. 61/714,995, filed Oct. 17, 2012. The entirety of the above applications is incorporated herein by reference.

BACKGROUND

The retention time of Dynamic Random Access Memory (DRAM) bit cells is determined by many factors such as the size of the bit cell capacitor, the operating voltage, the capacitance of the bitline, and the semiconductor process. In a typical DRAM, the bit cells do not have identical retention times. Rather, there is some cell-to-cell variation in retention times that typically conforms to a statistical distribution function.

The cells having retention times in the lower tail of this distribution curve are sometimes referred to as "weak" cells. The weak cells are randomly distributed across the DRAM, and their locations vary from DRAM to DRAM. These weak cells affect the yield (ratio of good die to total die on a wafer), determine the refresh interval of the DRAM, and may also cause single bit errors during operation.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments follows.

An error correcting code (ECC) can be used to store data in a dynamic random access memory (DRAM) to increase the yield, lengthen the refresh interval, and also correct single bit errors. For example, to correct a single weak cell in the 64 cells involved in a column access of a DDR3 DRAM with 8 data pins (i.e. a ×8 DDR3 DRAM), a [72, 64] ECC scheme may be used. Data Mask (DM) functionality in a DRAM allows the memory controller to read from and write to a single byte in the DRAM. Support for DM typically requires the use of a [12, 8] ECC scheme because it allows a single byte to be written without having to do a read-modify-write operation of the 64 memory cells associated with a column access. However, there is a considerable cost attached to ECC. A [12, 8] ECC is compatible with a data mask (DM) operation but requires 50% more bits per DRAM to store the data. Using ECC across the board in a DRAM can be wasteful, as most of the storage memory cells in a DRAM operate acceptably (i.e., meet the target charge retention time and are not shorted to a power or ground rail).

Embodiments described herein provide a selective ECC and partial-row replacement in a DRAM. In some embodiments, ECC may be applied only to rows that are known to contain weak memory cells. The ECC bits can be stored in the DRAM array as are the data bits. Such embodiments are more cost-effective than methods of applying ECC to all rows because applying ECC to rows that do not have weak memory cells is wasteful and unnecessary. In alternative embodiments, a portion of a row that is known to contain weak memory cells may be replaced with a portion of an ECC row.

Embodiments may further provide both bit replacement and selective ECC within the same array. Thus, a DRAM repair process in some embodiments may provide for replacing defective rows and columns with spare rows and columns respectively, as well as selectively applying ECC to defective rows or portions of rows. The choice of which repair mechanism to use may be managed by control circuitry described below with reference to FIGS. 7A-12, and may be determined by a number of factors, including the number and nature of the defects, the design and organization of the memory, the availability of repair resources (i.e., spare rows and ECC storage memory cells), and yield (i.e. ratio of good dice to total dice on a wafer) calculations.

Figure 1A:
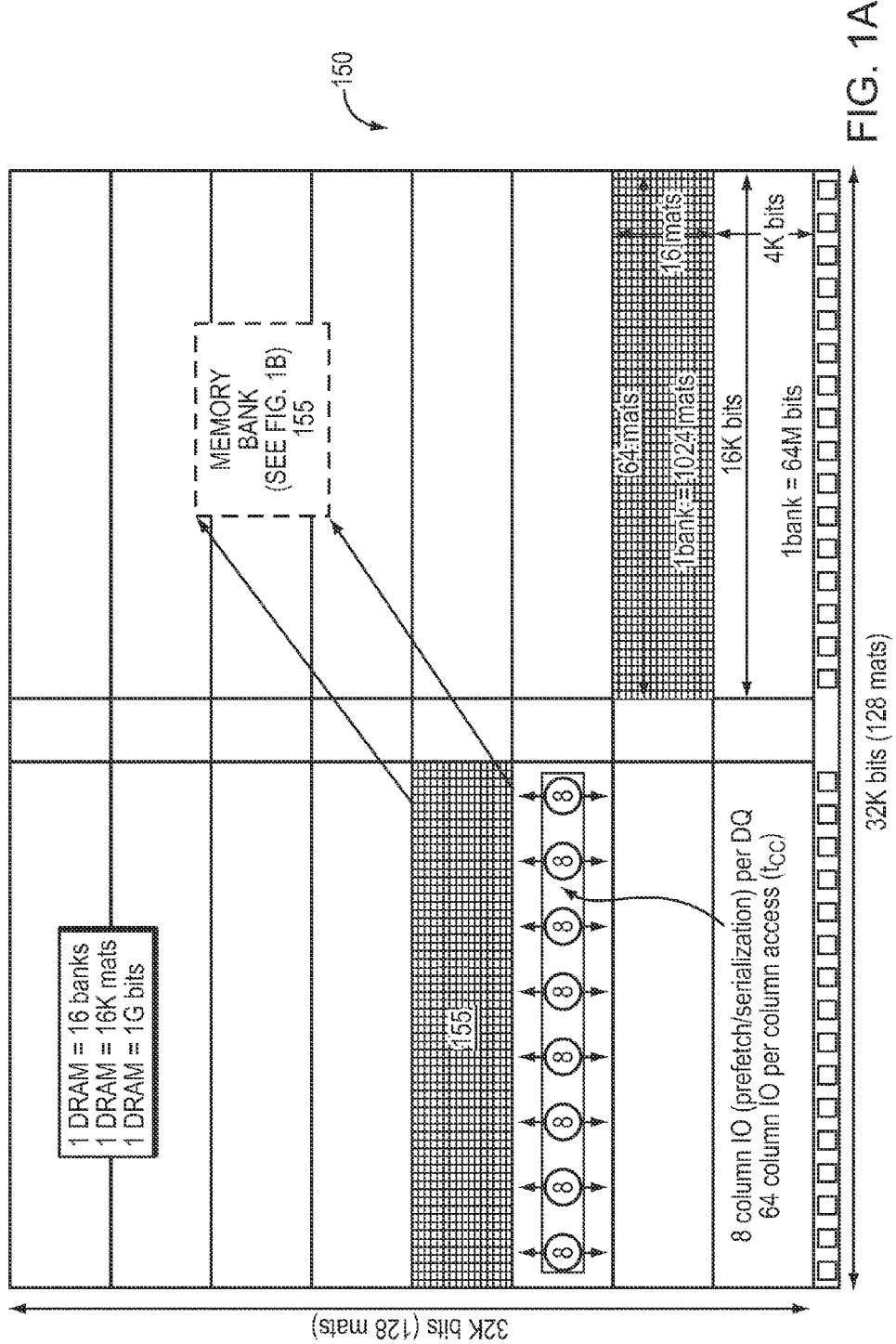
FIG. 1A is a block diagram of a DRAM array in an example embodiment.

FIG. 1A is a block diagram of a DRAM array 150 in an example embodiment. The DRAM component consists of "mats" (memory array tiles), which are organized into rows and columns. Each mat is depicted as a small square, and is grouped with other mats into banks. Each mat comprises an array of storage memory cells, each of which includes a capacitor element and an access transistor element. In the example embodiment shown in FIG. 1A, the DRAM is a 1 Gbit DRAM having 16 banks, where each bank comprises 1K mats and each mat includes a 256×256 array of storage memory cells. A single bank 155 is described in further detail below with reference to FIG. 1B.

Figure 1B:
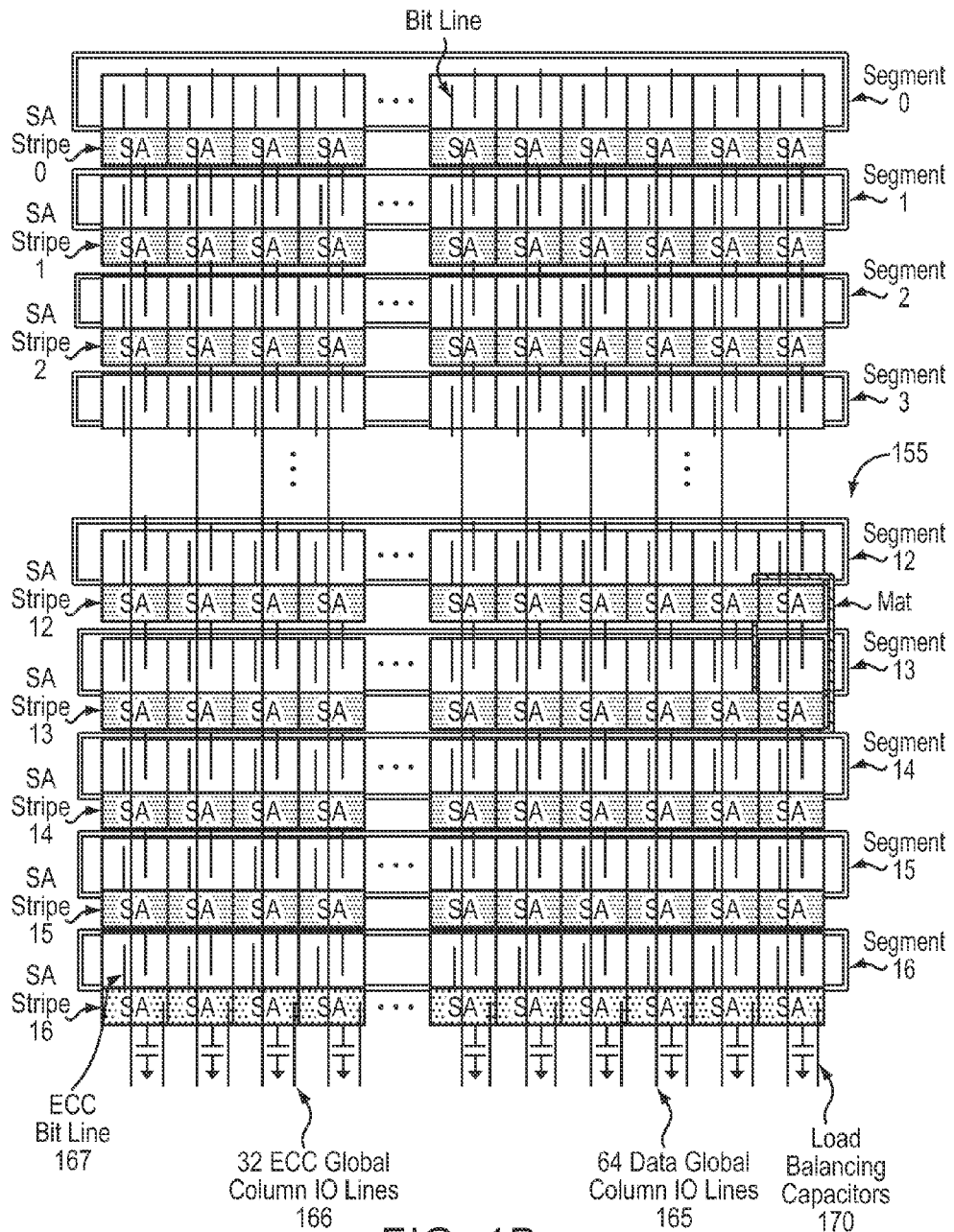
FIG. 1B is a block diagram of a DRAM bank in an example embodiment.

FIG. 1B is a block diagram of a bank 155 of a DRAM array in an example embodiment. The bank 155 includes multiple segments (e.g., segments 0-16) and sense amplifier (SA) stripes (e.g., SA stripes 0-16). A segment may include an array (e.g. 256×256) of memory cells, row decoders, and other miscellaneous circuits, and a SA stripe may include sense amplifiers, column decoders, and other circuitry to facilitate operation of the DRAM. The bank 155 includes 1K mats arranged in 16 rows of 64 mats. Thus, each segment includes a 16K×256 ((64*256)×256) array of memory cells, and a SA stripe includes 8K (64*128) sense amplifiers. The sense amplifiers in a mat can be connected to one or more Global Column input/output (I/O) line(s) 165 that run through the mat. The word lines in the mat may be controlled by a Row Decode block (i.e., row decoder circuits, not shown). The address inputs to the Row Decode block are provided from a Row Addr/En block (not shown), which determines whether the mat must respond to the incoming Global Row Addr signals (i.e., whether the mat is the target of a row operation). The Column Decode block (not shown) selects which, if any, sense amplifier(s) (SA) to couple to the Global Column I/O line(s). The Column Decode block is controlled by the Column Addr/En block (not shown), which determines if the mat needs to respond to the incoming Global Column Addr signals (i.e. if the mat is the target of a column operation). The Global Column I/O lines 165 are connected to the I/O Interface Cell (not shown), which serializes and transmits the signals on the Global Column I/O lines 165 to an external (e.g., memory controller) device (in the case of a read operation) or receives signals from the external device, deserializes them, and drives the deserialized signals onto the Global Column I/O lines 165 (in the case of a write operation).

In the bank architecture shown in FIG. 1B, each SA stripe senses memory cells in the two adjoining segments. For example, sense amplifier (SA) stripe 1 senses memory cells in segments 1 and 2. However, segments 0 and 16 are organized differently from the other segments. Because each of these segments is at the edge of the bank, there is no SA stripe on the other side of the segment. As a result, segments 0 and 16 use only half the bit lines of the other segments, as each of these segments has only half the number of sense amplifiers associated with it when compared to the other segments. The other bit lines and their associated memory cells are typically provided as dummy elements in order to match the electrical characteristics of segments 0 and 16 with those of the other segments. This means that segments 0 and 16 include only half the number of usable memory cells as the other segments (i.e., an 8K×256 array of cells). Segment 0 and segment 16 are therefore typically accessed together to provide the same number of memory cells as when accessing one of the segments 1 through 15.

Figure 15:
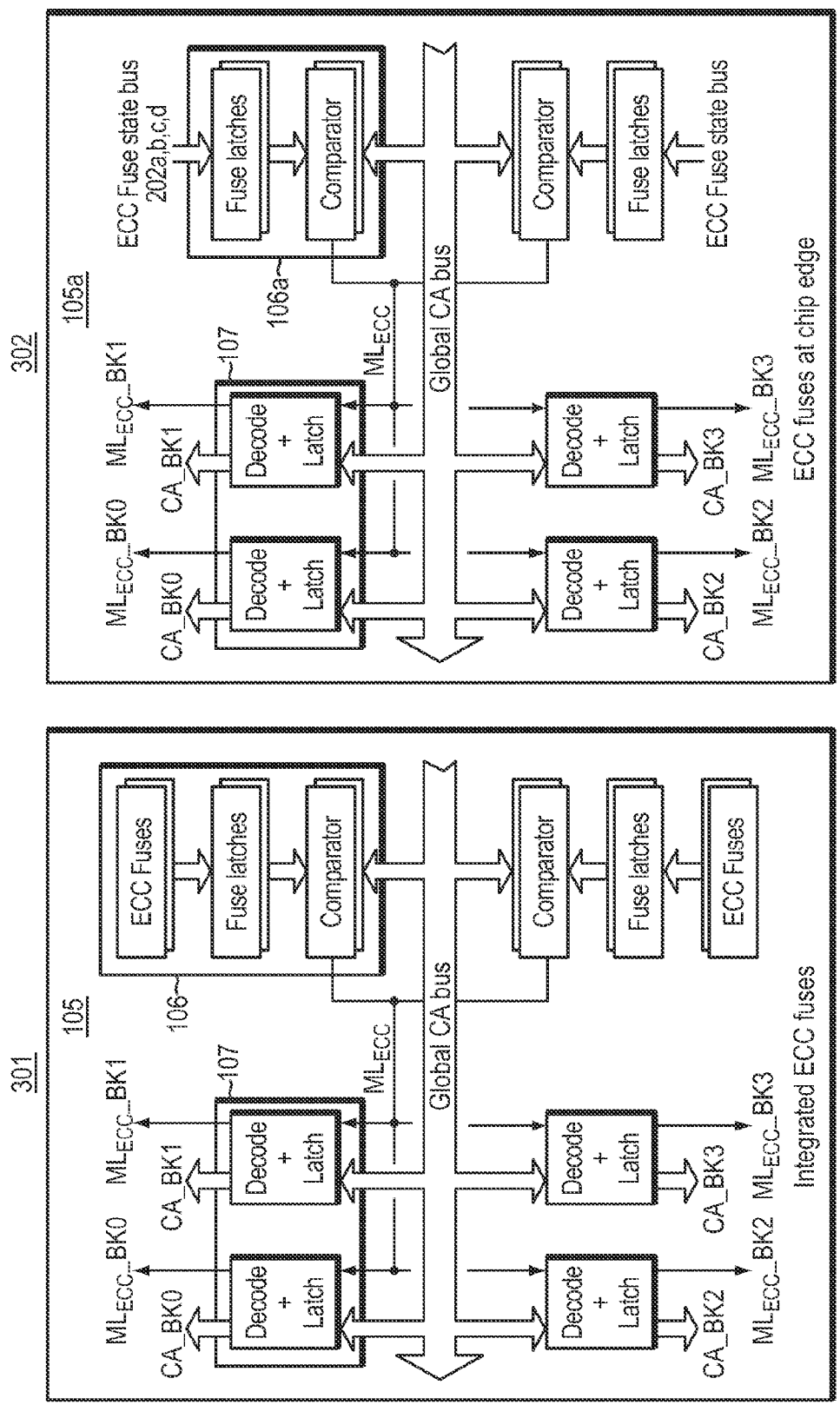
FIG. 15 is a block diagram illustrating the storage and use of addresses of defective rows in other embodiments.

In the architecture shown in FIG. 1B, 15 of the 16 rows of 64 mats in the bank shown in FIG. 1A correspond to the 15 inner segments (i.e. segments 1 through 15) shown in FIG. 1B. For example, the first row of mats in the bank in FIG. 1A may correspond to segment 1 of FIG. 1B, the second row of mats in FIG. 1A may correspond to segment 2 in FIG. 1B, and the 15th row of mats in FIG. 1A may correspond to segment 15 in FIG. 1B. Furthermore, the $16^{th}$ row of mats in FIG. 1A corresponds to the two outer segments (i.e. segments 0 and 16) in FIG. 1B. Accordingly, a row access cycle to the 1st row of mats in FIG. 1A will result in a word line being asserted in segment 1 in FIG. 1B. In the bank architecture shown in FIG. 1B, SA stripe 16 is provided to form segment 16 as a standard segment of bit lines matching the segments 1-15, in contrast to prior architectures that implement dummy bit lines in segment 16. The memory cells of segment 16 that are accessible through ECC bit lines (e.g., ECC bit line 167) and SA stripe 16 in FIG. 1B may be used to store ECC syndrome bits for data bits stored in memory cells in the bank. The sense-amplifier stripe 16 may be balanced with load capacitors 170 as shown, or by reference bitlines.

As a result of this configuration, a row access cycle to segment 16 (corresponding to a row access cycle to the $16^{th}$ row of mats in the bank which causes word lines to be asserted in segments 0 and 16) results in 16K memory cells being accessed in segment 16. Half (8K out of 16K) of these memory cells contain data bits and are sensed by SA stripe 15. The other 8K memory cells contain ECC bits and are sensed by SA stripe 16. A column access cycle to SA stripe 16 will result in 32 ECC bits being selected. These bits may be routed to the I/O Interface Cell over 32 ECC Global Column I/O lines 166. This configuration is compatible with the Data Mask function because 32 ECC bits are accessed when 64 data bits (32 from SA stripe 0 and 32 from SA stripe 15) are read or written. Accordingly, a [12, 8] ECC code may be implemented with the DRAM architecture of this embodiment.

To facilitate cell repair within the DRAM array, when one or more defective cells are identified, an ECC syndrome is calculated for a unit of data (e.g. for 8 bits of data) that is to be stored in that portion of the DRAM array. The ECC syndrome and the unit of data is then stored in the DRAM array. For example, a portion of the DRAM array may be a row of memory cells in the array, a portion of a row of memory cells, or may be a group of rows of memory cells in the array. ECC may therefore be omitted from application to the portions of the DRAM array that do not contain any weak cells. The resulting selective ECC is therefore more cost-effective and more power-efficient than applying ECC to the entire DRAM array.

Figure 1C:
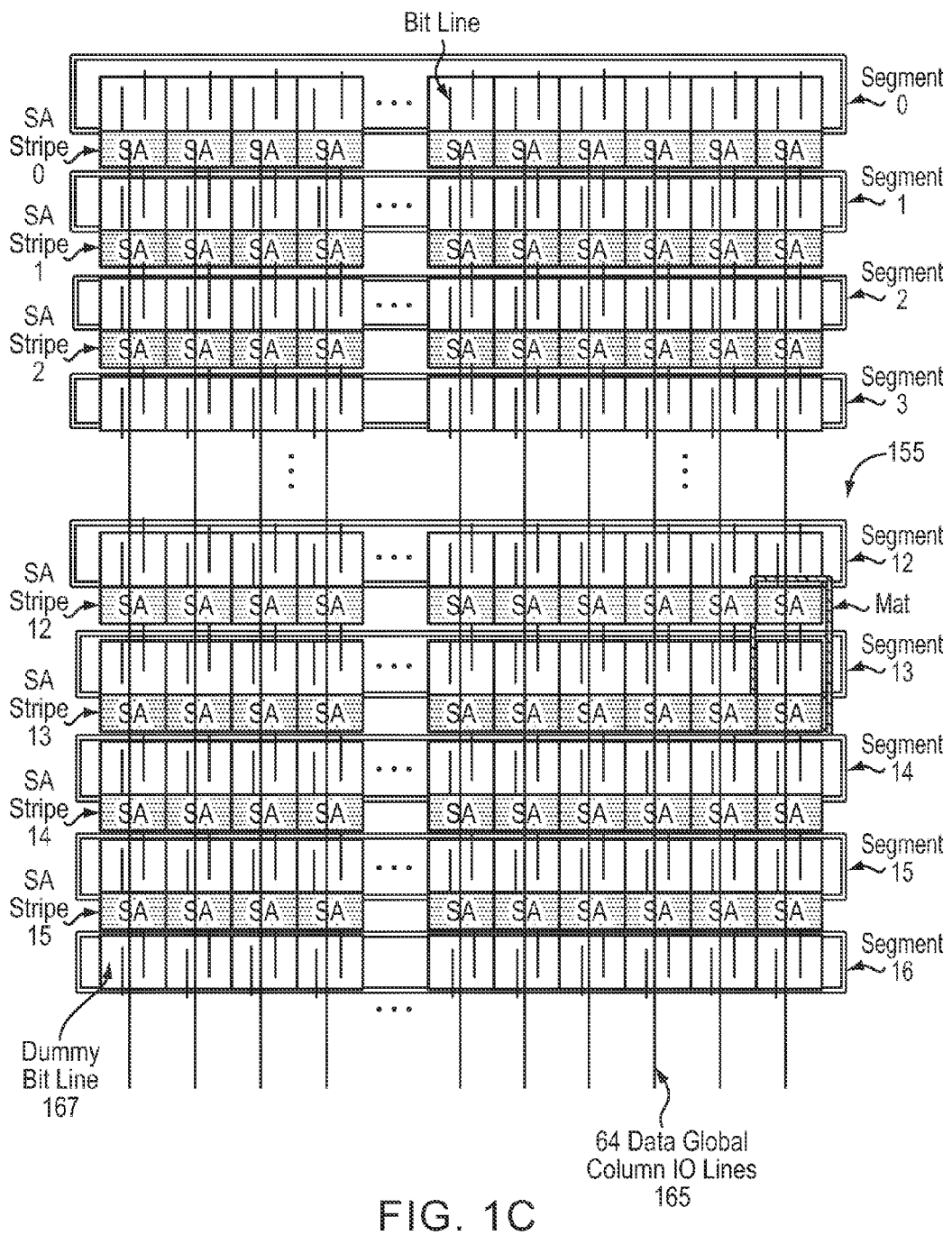
FIG. 1C is a block diagram of a DRAM bank.

The bank 155 shown in FIG. 1C includes multiple segments containing a plurality of memory cells and multiple sense amplifier (SA) stripes. Each SA stripe senses memory cells in the two adjoining segments. For example, sense amplifier (SA) stripe 1 senses memory cells in segments 1 and 2. However, segments 0 and 16 are organized differently from the other segments. Because each of these segments is at the edge of the bank, there is typically no SA stripe on one side of the segment. As a result, segment 0 uses only half the bit lines of the other segments, as this segment has only half the number of sense amplifiers associated with it when compared to the other segments (1-15). The other bit lines in segment 0 and their associated memory cells are typically provided as dummy elements in order to match the electrical characteristics of segment 0 with those of the other segments. This means that segment 0 includes only half the number of usable memory cells as the other segments (i.e., an 8K×256 array of cells). In a typical DRAM embodiment, segment 16 is a replica of segment 0. Segment 0 and segment 16 are therefore typically accessed together to provide the same number of memory cells as when accessing one of the segments 1 through 15.

Figure 1D:
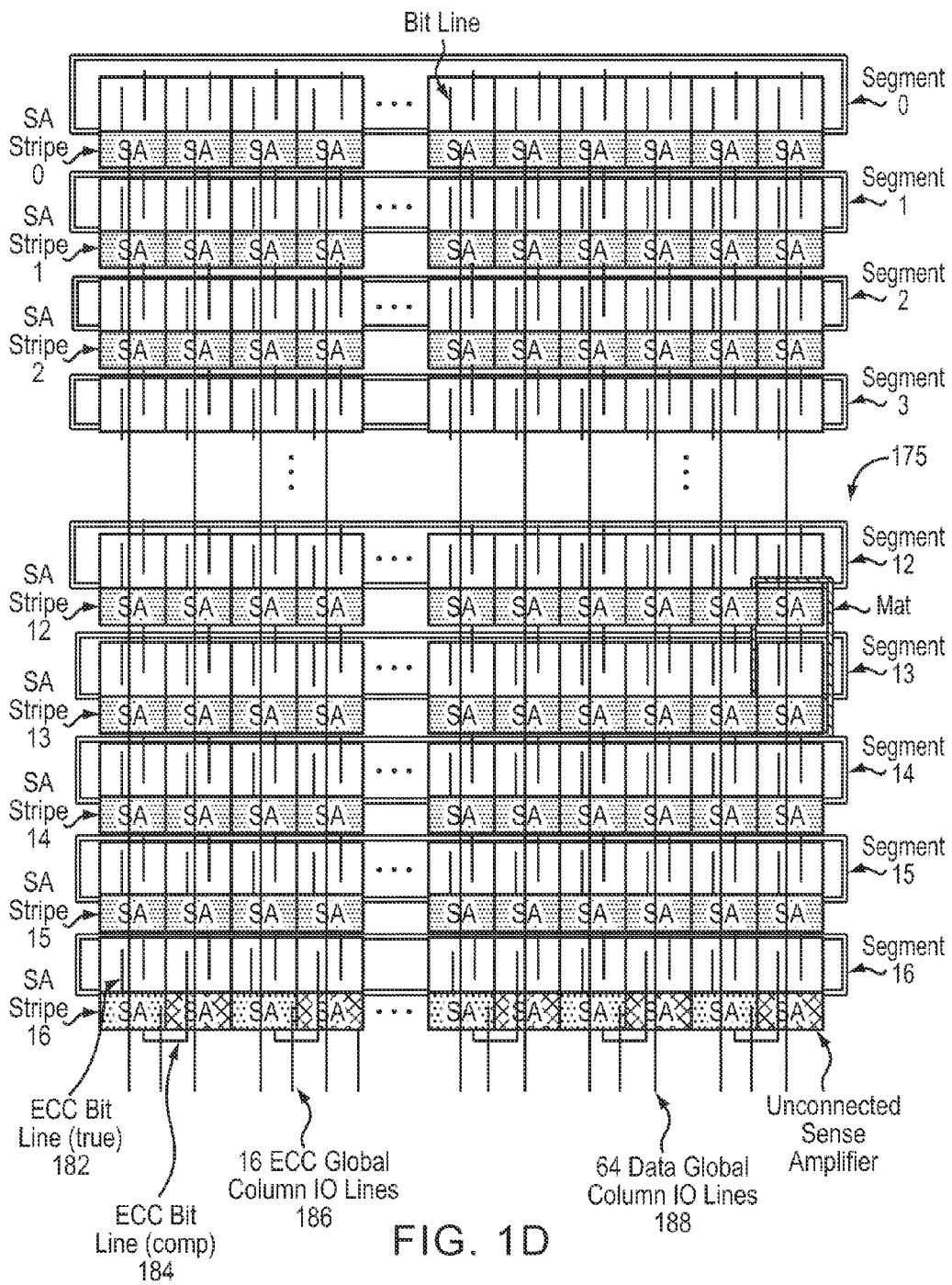
FIG. 1D is a block diagram of a DRAM bank in an example embodiment.

FIG. 1D shows the architecture of a bank 175 in one embodiment. In this architecture, segment 16 includes sense amplifiers (SA Stripe 16) that connect to the previously dummy bit lines and memory cells, in contrast to the architecture shown in FIG. 1C. Connectivity is such that every other sense amplifier in SA Stripe 16 is coupled to two bit lines in segment 16, which operate as True/Compliment (T/C) bit lines. The memory cells of segment 16 that are accessible through the T/C bit lines (e.g., ECC true bit line 182 and ECC complement bit line 184) and SA stripe 16 in FIG. 1D may be used to store ECC syndrome bits for data bits stored in memory cells in the bank. Use of the T/C bit line approach ensures that the sense-amplifiers in SA Stripe 16 are balanced. The balanced sense amplifiers with T/C bit lines result in superior operating margins for the associated memory cells that contain the ECC syndrome.

The unconnected sense amplifiers in SA Stripe 16 may be used for lithographic pattern fill and also to provide pitch matched area for wiring of the T/C bit lines to adjacent data path and/or ECC related logic circuits. In other embodiments, SA stripe 16 may contain only half the number the sense amplifiers and thus, not have any unconnected sense amplifiers.

As a result of this configuration, a row access cycle to segment 16 (corresponding to a row access cycle to the $16^{th}$ row of mats in the bank which causes word lines to be asserted in segments 0 and 16) results in 16K memory cells being accessed. Half (8K out of 16K) of these memory cells contain data bits and are sensed by SA stripe 15. The other 8K memory cells contain ECC bits and are sensed by sense amplifiers with T/C bit lines in SA stripe 16. This results in 4K unique ECC bits being sensed by SA stripe 16. Therefore, a column access cycle to SA stripe 16 will result in 16 ECC bits being selected. These bits may be routed to the I/O Interface Cell over 16 ECC Global Column I/O lines 186. For a memory device that accesses 32 data bits from the core on a column access cycle (e.g. a ×4 DDR3 DRAM), this configuration is compatible with the Data Mask function because 16 ECC bits may be accessed when 32 data bits (16 from SA stripe 0 and 16 from SA stripe 15) are read or written. Accordingly, a [12, 8] ECC code may be implemented with the DRAM architecture of this embodiment.

For a memory device that accesses 64 data bits from the core on a column access cycle (e.g. ×8 DDR3 DRAM), the 16 ECC bits may be distributed among the eight data bytes, thus providing selective ECC coverage for half of the eight data bytes. Fuses activated based on test results, enable muxes to steer the 16 ECC bits to half of the 64 data bits on a per column access. Since weak memory cells are random in nature, a means to select which of the eight bytes is corrected is provided. FIG. 7X illustrates a block diagram of 12/8 ECC circuits to support 64 data bits with 16 ECC bits for a read operation.

Figure 2A:
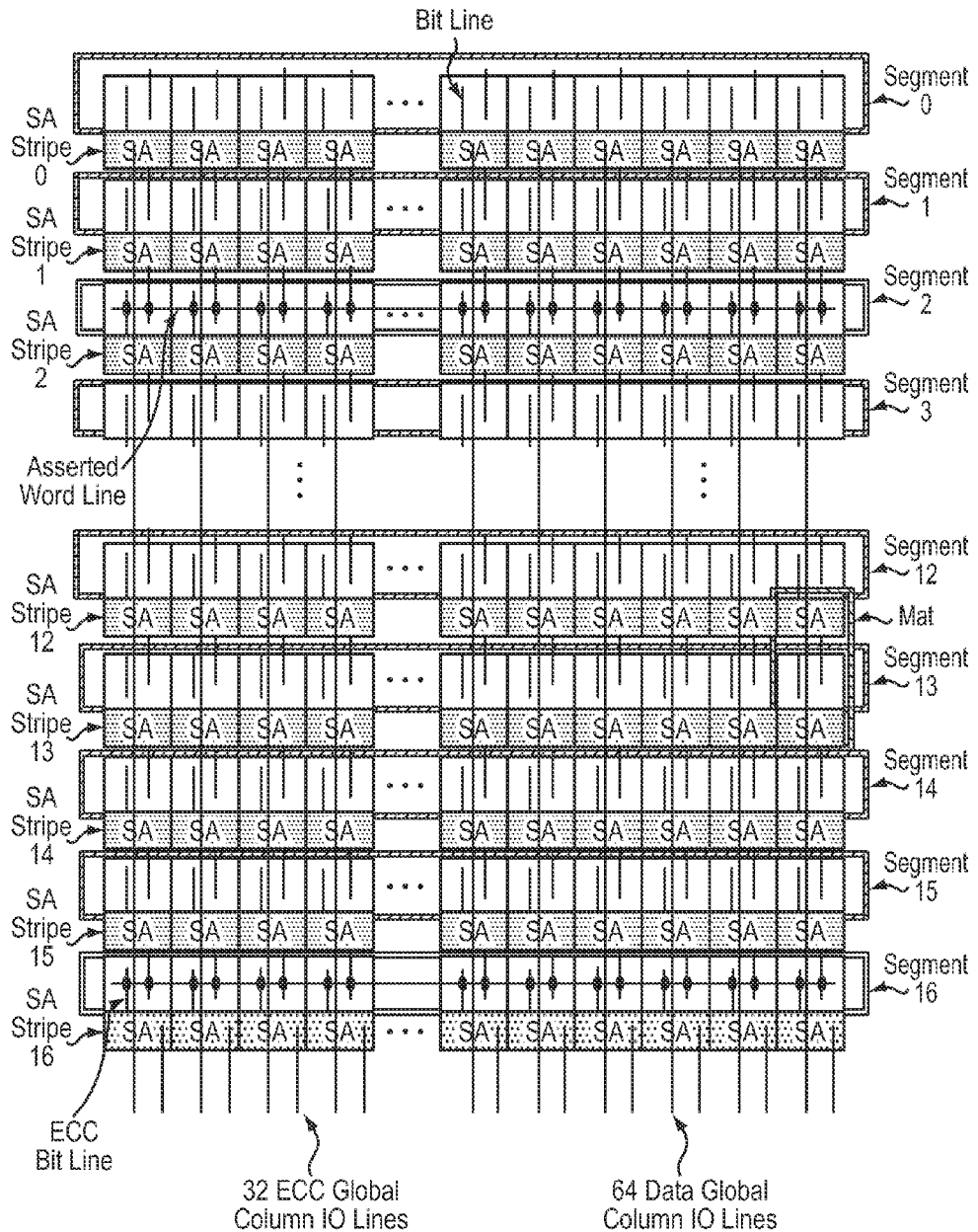
FIG. 2A is a block diagram illustrating an operation of a DRAM bank in one embodiment.

FIG. 2A shows one example use case of the embodiment illustrated in FIGS. 1A-B. Here, a row access cycle is targeted at a defective data row (e.g. a row with one or more weak cells) in segment 2. This causes a word line in segment 2 to be asserted, causing the 16K memory cells connected to the word line to place their contents on the bit lines in segment 2. These bit lines are sensed and amplified by sense amplifier (SA) stripes 1 and 2. In parallel, the word line for the associated ECC row in segment 16 is asserted. This causes the 16K memory cells connected to the word line to place their contents on the bit lines in segment 16. These bit lines are sensed and amplified by SA stripes 15 and 16. As mentioned above, 8K of the 16K memory cells sensed contain ECC bits and these are sensed by SA stripe 16. The column access cycle that follows the row access cycle will select 64 data bits (32 from SA stripe 1 and 32 from SA stripe 2) and 32 ECC bits (from SA stripe 16). The selected data bits are coupled to the 64 Data Global Column I/O lines running through the array and connecting to an input/output (I/O) Interface Cell block. Additionally, the selected ECC bits are coupled to the 32 ECC Global Column I/O lines running from segment 16 to the I/O Interface Cell block. Since the ECC bits are only stored in segment 16 in this embodiment, the 32 ECC Global Column I/O lines need not run throughout the entire bank array. It should also be noted that 8K of the 16K memory cells accessed in segment 16 contain data bits, and are sensed by SA stripe 15. These cells do not participate in the column access cycle. Thus, reading the ECC memory cells in segment 16 performs a refresh of the data memory cells that share the same word line as the ECC memory cells.

Because the data bits and the ECC bits are in separate segments in the use case shown in FIG. 2A, any defective row (containing data bits) in segment 2 may be associated in some embodiments with any ECC row in segment 16. The same is true for any defective row (containing data bits) in segments 1 through 14. That is, any defective row in segments 1 through 14 may be associated in some embodiments with any ECC row in segment 16. In other embodiments, a set associative mapping of defective rows to ECC rows may be used, wherein an ECC row may be associated with only a set of defective rows where the set is smaller than the total number of data rows in the DRAM. Other mappings of defective rows to ECC rows may also be used.

Figure 2B:
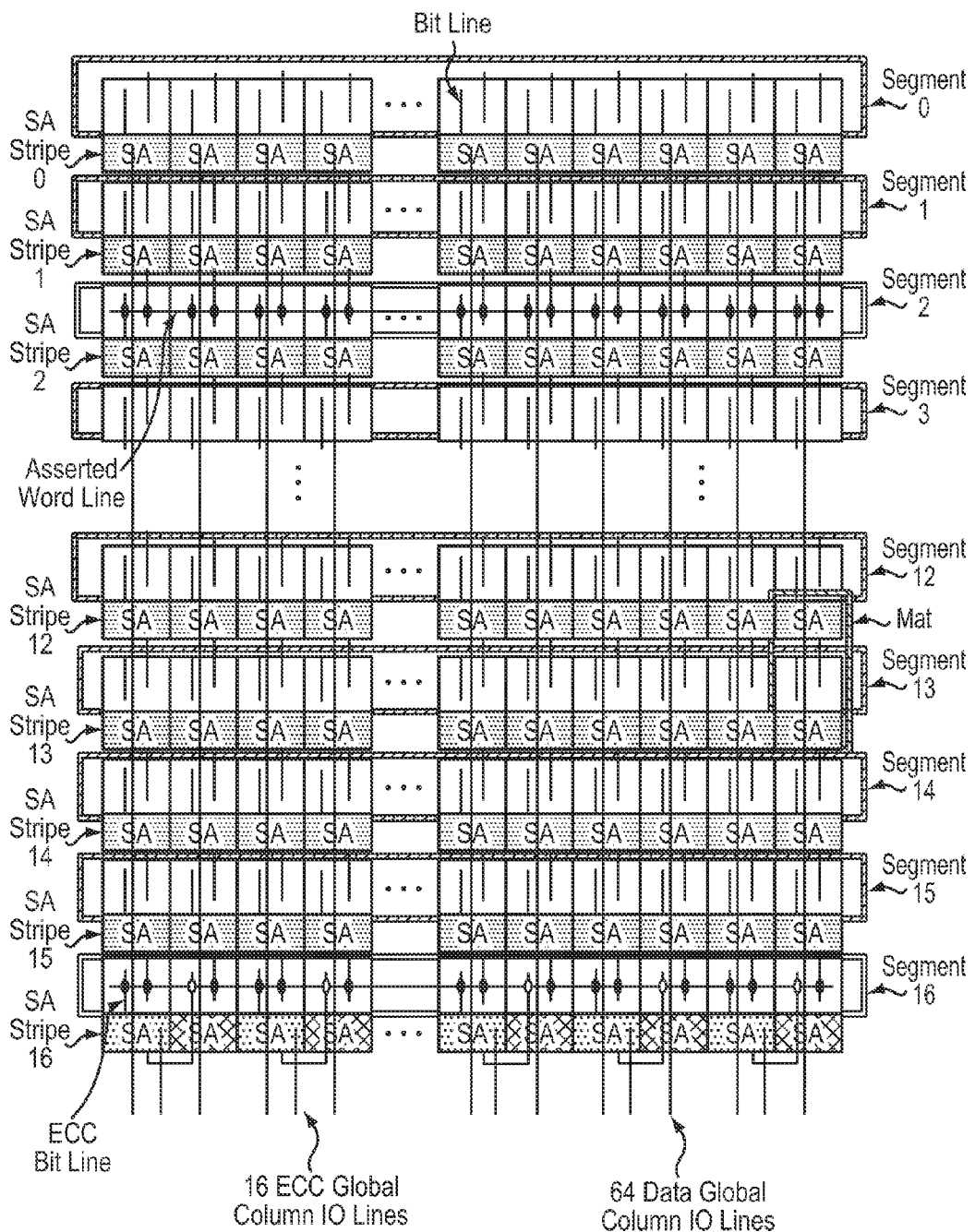
FIG. 2B is a block diagram illustrating an operation of a DRAM bank in one embodiment.

FIG. 2B shows one example use case of the embodiment illustrated in FIG. 1D. Here, a row access cycle is targeted at a defective data row (e.g. a row with one or more weak cells) in segment 2. This causes a word line in segment 2 to be asserted, causing the 16K memory cells connected to the word line to place their contents on the bit lines in segment 2. These bit lines are sensed and amplified by sense amplifier (SA) stripes 1 and 2. In parallel, the word line for the associated ECC row in segment 16 is asserted. This causes the 16K memory cells connected to the word line to place their contents on the bit lines in segment 16. These bit lines are sensed and amplified by SA stripes 15 and 16. As mentioned above, 8K of the 16K memory cells sensed contain the T/C ECC bits and these are sensed by SA stripe 16. The column access cycle that follows the row access cycle will select 64 data bits (32 from SA stripe 1 and 32 from SA stripe 2) and 16 ECC bits (from SA stripe 16). The selected data bits are coupled to the 64 Data Global Column I/O lines running through the array and connecting to an input/output (I/O) Interface Cell block. Additionally, the selected ECC bits may be coupled to the 16 ECC Global Column I/O lines running from segment 16 to the I/O Interface Cell block. Since the ECC bits are only stored in segment 16 in this embodiment, the 16 ECC Global Column I/O lines need not run throughout the entire bank array. It should also be noted that 8K of the 16K memory cells accessed in segment 16 contain data bits, and are sensed by SA stripe 15. These cells do not participate in the column access cycle. Thus, reading the ECC memory cells in segment 16 performs a refresh of the data memory cells that share the same word line as the ECC memory cells.

Because the data bits and the ECC bits are in separate segments in the use case shown in FIG. 2B, any defective row (containing data bits) in segment 2 may be associated in some embodiments with any ECC row in segment 16. The same is true for any defective row (containing data bits) in segments 1 through 14. That is, any defective row in segments 1 through 14 may be associated in some embodiments with any ECC row in segment 16. In other embodiments, a set associative mapping of defective rows to ECC rows may be used, wherein an ECC row may be associated with only a set of defective rows where the set is smaller than the total number of data rows in the DRAM. Other mappings of defective rows to ECC rows may also be used.

Figure 3A:
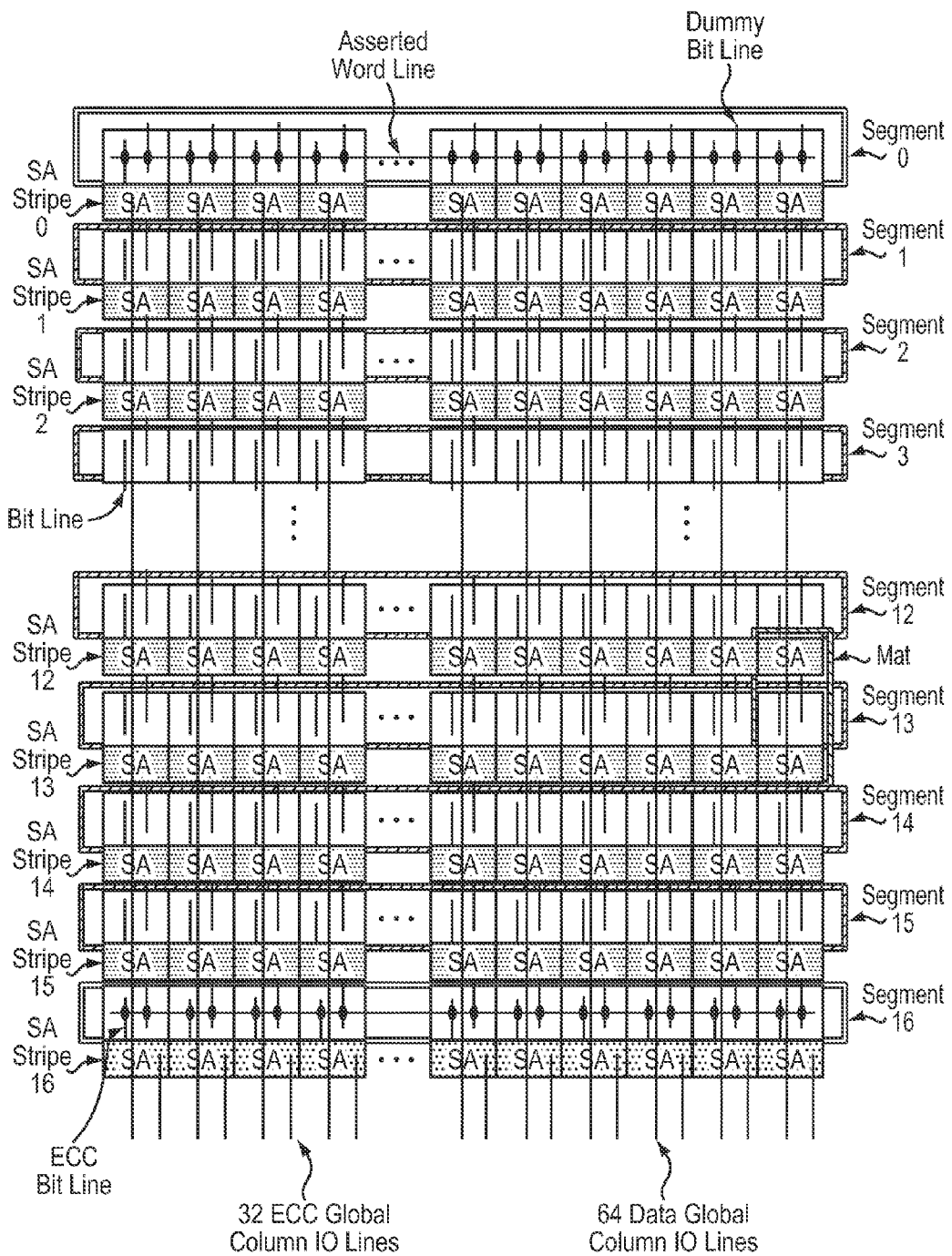
FIG. 3A is a block diagram illustrating a further operation of a DRAM bank in one embodiment.

FIG. 3 shows another use case of the embodiment illustrated in FIGS. 1A-B. A row access cycle is targeted at a defective data row in segments 0 and 16. Since these segments contain half the number of data memory cells as the other segments, a word line in segment 0 and a word line in segment 16 are asserted, causing the 16K memory cells connected to the two word lines to place their contents on the data bit lines in segments 0 and 16. These bit lines are sensed and amplified by sense amplifier (SA) stripes 0 and 15. Asserting a word line in segment 16 also causes 8K memory cells containing ECC bits that are controlled by the asserted word line in segment 16 to be sensed by SA stripe 16. Since no other word line can be asserted in segment 16, the ECC bits for the defective row must necessarily share the same word line in segment 16. In other words, a defective row in segment 16 (and 0) must be associated with the ECC row in segment 16 that shares the same word line.

Figure 3B:
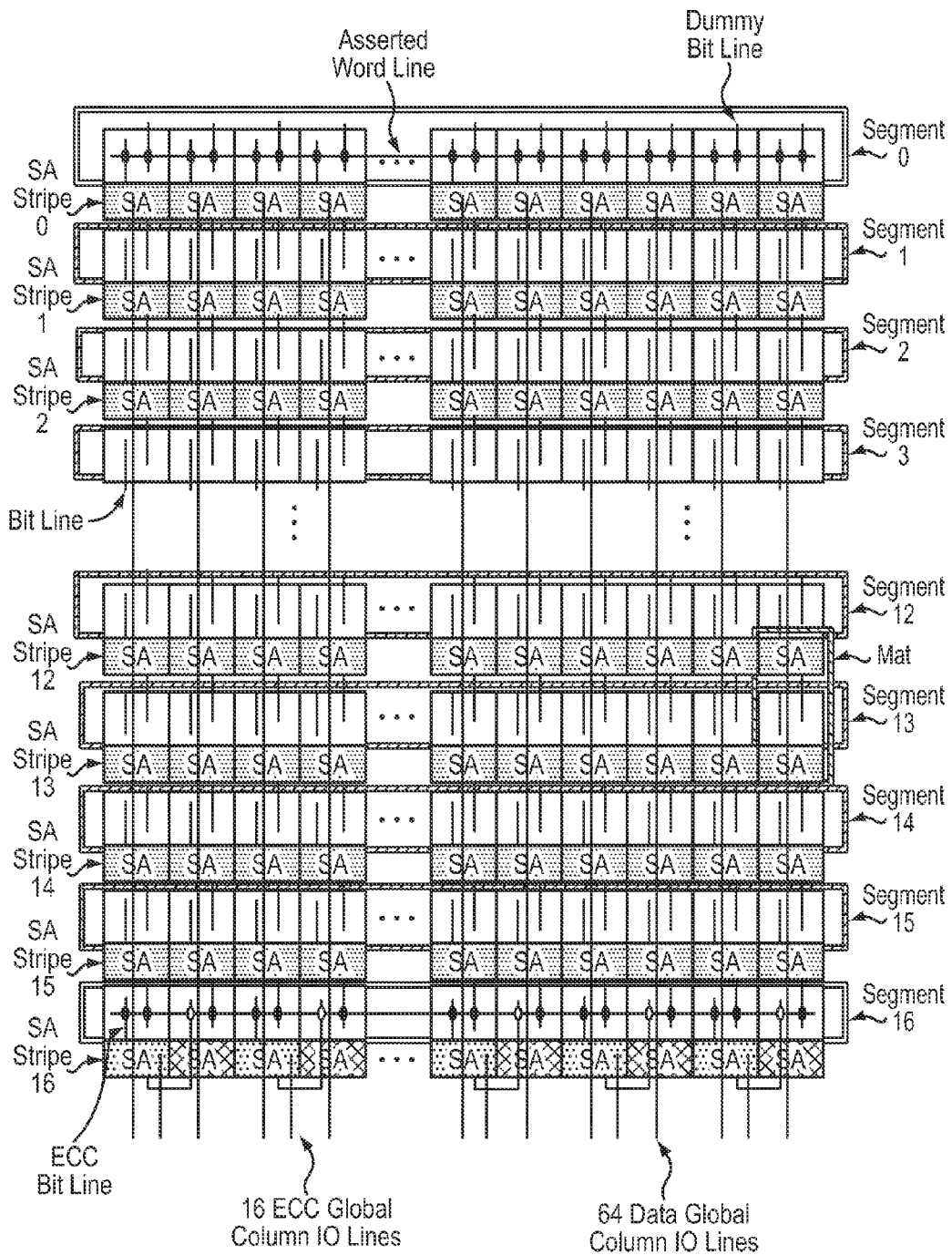
FIG. 3B is a block diagram illustrating a further operation of a DRAM bank in one embodiment.

As in the use case illustrated in FIG. 2A, a column access cycle to the rank will select 64 data bits (32 from SA stripe 0 and 32 from SA stripe 15) as well as 32 ECC bits from SA stripe 16. The data bits will then be coupled to the 64 Data Global Column I/O lines while the 32 ECC bits will be coupled to the 32 ECC Global Column I/O lines. FIG. 3B shows another use case of the embodiment illustrated in FIG. 1D. A row access cycle is targeted at a defective data row in segments 0 and 16. Since these segments contain half the number of data memory cells as the other segments, a word line in segment 0 and a word line in segment 16 are asserted, causing 16K memory cells connected to the two word lines to place their contents on the data bit lines in segments 0 and 16. These bit lines are sensed and amplified by sense amplifier (SA) stripes 0 and 15. Asserting a word line in segment 16 also causes 8K memory cells containing T/C ECC bits that are controlled by the asserted word line in segment 16 to be sensed by SA stripe 16. Since no other word line can be asserted in segment 16, the ECC bits for the defective row must necessarily share the same word line in segment 16. In other words, a defective row in segment 16 (and 0) must be associated with the ECC row in segment 16 that shares the same word line.

As in the use case illustrated in FIG. 2B, a column access cycle to the rank will select 64 data bits (32 from SA stripe 0 and 32 from SA stripe 15) as well as 16 ECC bits from SA stripe 16. The data bits will then be coupled to the 64 Data Global Column I/O lines while the 16 ECC bits will be coupled to the 16 ECC Global Column I/O lines.

A row contains 16 k memory cells (256 columns of 64 memory cells). If a row is to be repaired, an additional 8 k memory cells connected as True/Compliment (256 columns of 16 memory cells) is made available as ECC bits from SA Stripe 16. The word lines including ECC parity bits in segment 16 can repair 512 rows in the example DRAM.

Figure 4:
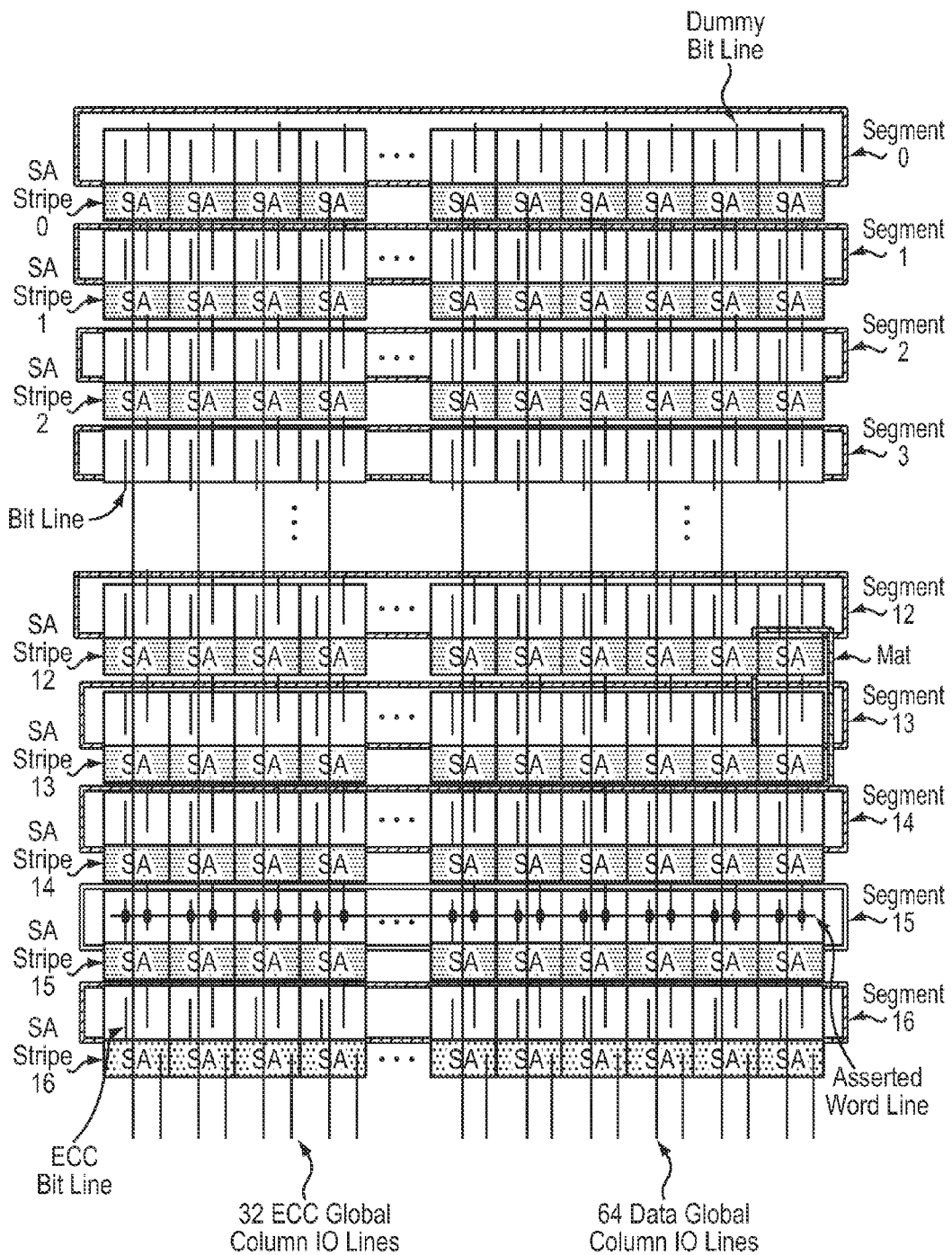
FIG. 4 is a block diagram illustrating a still further operation of a DRAM bank in one embodiment.

FIG. 4 shows yet another use case of the embodiment illustrated in FIG. 2. Here, a row access cycle is targeted at a defective data row in segment 15. This causes a word line in segment 15 to be asserted, causing the 16K memory cells connected to the asserted word line to place their contents on the data bit lines in segment 15. These bit lines are sensed and amplified by sense amplifier (SA) stripes 14 and 15. In this case, asserting a word line in segment 16 to access ECC bits will cause a conflict in SA stripe 15 since SA stripes 15 and 16 are required to sense the 8K data bits and the 8K ECC bits associated with a word line in segment 16. As a result, ECC cannot be applied to a defective row in segment 15 in this embodiment.

Figure 5:
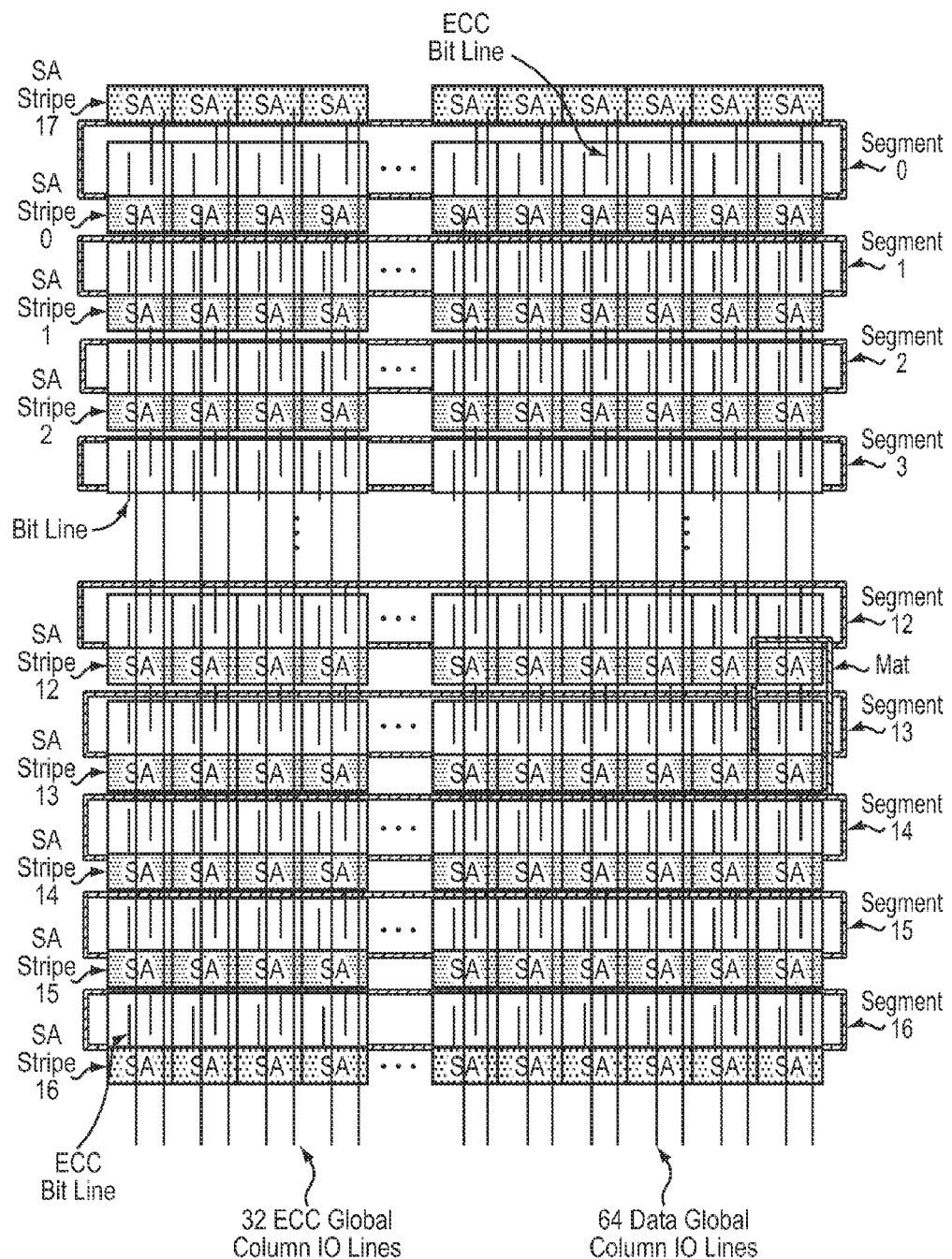
FIG. 5 is a block diagram illustrating a still further operation of a DRAM bank in one embodiment.

FIG. 5 shows a further operation in one embodiment. Here, as in FIG. 4, an open bit line architecture is used. However, in this embodiment, the dummy bit lines in both segments 0 and 16 that would be implemented in conventional memory arrays are converted to standard bit lines and used to store ECC syndrome bits. This configuration allows ECC to be applied to a defective row in any segment. For example, a defective row in segment 2 can be associated with an ECC row in either segment 0 or segment 16, a defective row in segment 1 can be associated with an ECC row in segment 16, and a defective row in segment 15 can be associated with an ECC row in segment 0. Since segments 0 and 16 include ECC rows in this embodiment, the 32 ECC Global Column I/O lines have to run through the entire bank. The row and column accesses in this embodiment are similar to that in the embodiment in FIG. 2.

Figure 6:
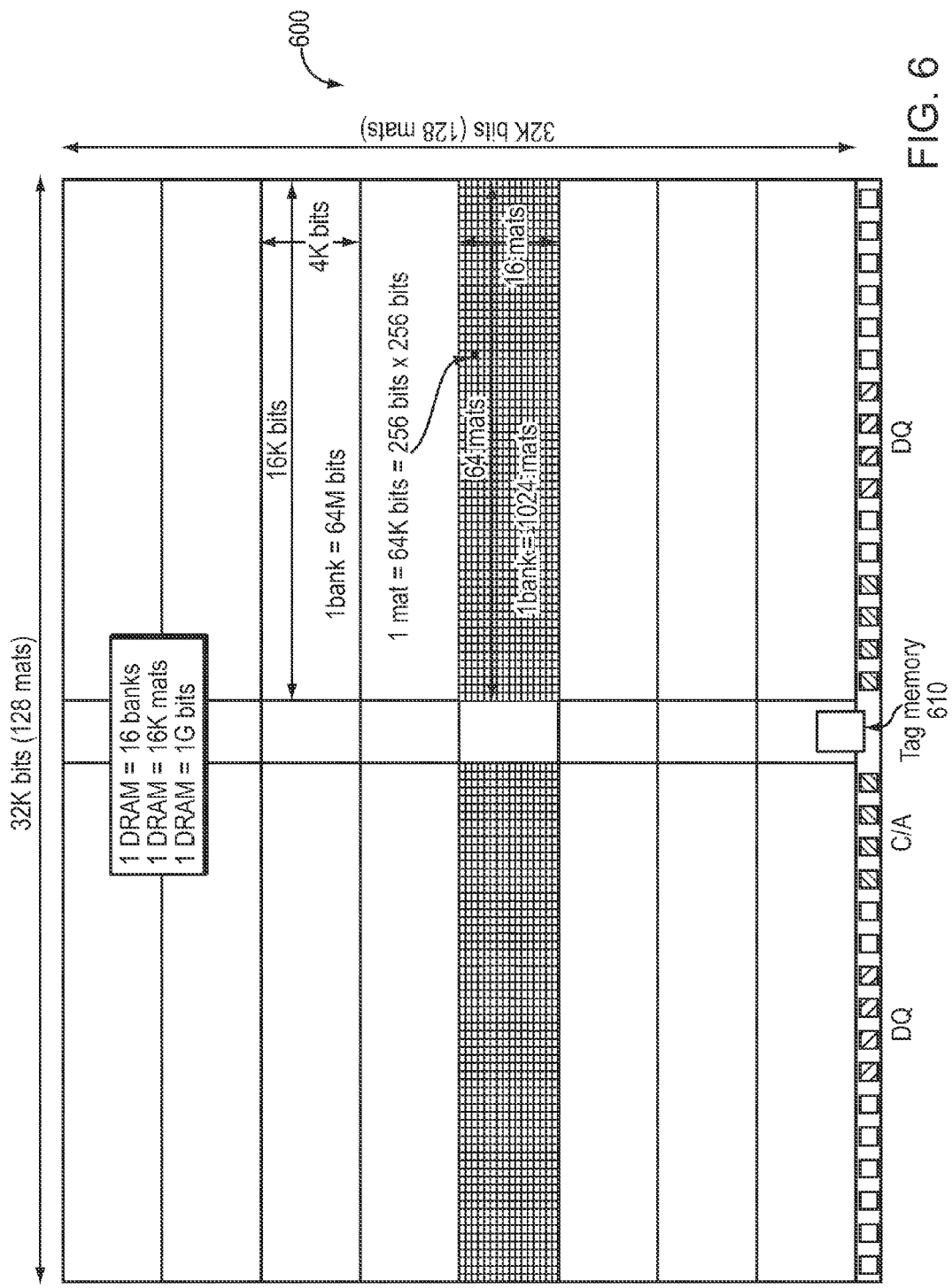
FIG. 6 is a block diagram of a DRAM memory device in a further embodiment.

FIG. 6 is a block diagram of a DRAM memory device 600 in a further embodiment. The association of a defective row with an ECC row can be done in a number of different ways. In one embodiment, shown in FIG. 6, the row addresses of the defective rows are stored in fuses 610 on the DRAM die. The fuses may either be laser fuses or e-fuses. Each ECC row may include an address comparator and an address latch. At power on, the address latch of each ECC row is loaded with the row address of the defective row that is associated with the ECC row. During a row access cycle, the address comparators of the ECC rows compare the incoming row address with the address in their respective latches. If the comparator detects a match, it directs the word line driver to assert the word line. In other embodiments, the addresses of the defective rows may be stored in external non-volatile memory and loaded into the address latches in the DRAM at power on.

Selective ECC may also be applied to 3 dimensional (3-D) DRAMs (e.g. a package that includes multiple DRAM dies that are stacked). In one embodiment, each DRAM in the stack has memory cells for storing ECC syndrome bits and also has on-die fuses that identify the defective rows containing data bits. In this embodiment, each DRAM has the ability to repair its own defective rows. In another embodiment, each DRAM in the stack has memory cells for storing ECC syndrome bits but the fuses that identify the defective rows in all the DRAMs in the stack are located in only one DRAM in the stack. In this embodiment, the information stored in the fuses will include the row address of the defective row and the device ID of the DRAM where the defective row is located. At power on, the information contained in the fuses is transmitted to all the DRAMs in the stack. Each DRAM monitors the transmitted information and determines if a specific defective row address is on that DRAM by comparing its own device ID with the device ID that is transmitted with the address of each defective row in the stack. If the IDs match, then the DRAM latches the transmitted data and then associates an ECC row with the defective row. In another embodiment, the memory cells for storing the ECC syndrome bits and the fuses identifying the defective rows are located in one DRAM in the stack. In this embodiment, the data for read and write accesses to any DRAM in the stack will traverse through the DRAM that contains the ECC memory cells and the on-die fuses that identify the defective rows. If the accessed row is not a defective row, then the data passes through the DRAM without any changes. If the accessed row is a defective row, then the DRAM generates and stores the ECC syndrome bits for the write data or checks and, if necessary, corrects the read data before transmitting the read data to an external device.

Figure 7A:
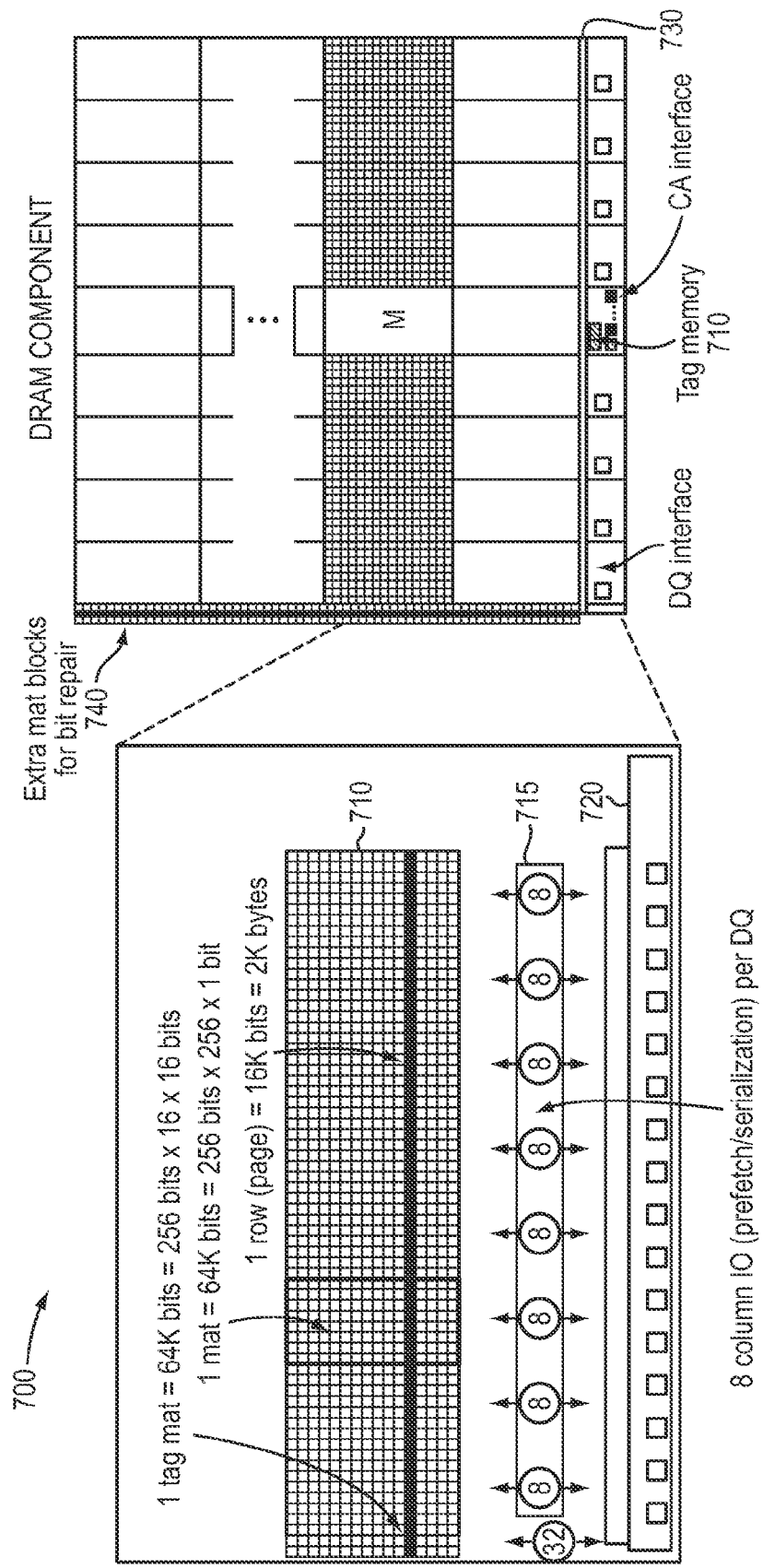
FIG. 7A is a block diagram of a DRAM array in one embodiment.

FIG. 7A is a block diagram of a DRAM device 700 in one embodiment. The DRAM device, or component circuit, is shown in its entirety at right, and at left is shown a portion of the DRAM circuit including a bank 710, control circuitry 720 and an interface 715. In the DRAM device 700, a supplemental horizontal group of mat blocks 730 is provided at the bottom of the DRAM array. In some embodiments, these supplemental mats 730 may be used for repair by storing the ECC syndrome bits. Further, one or more supplemental columns of mats 740 are provided at the left of the array. In some embodiments, these supplemental mats 740 may be used for repair via bit replacement. In other embodiments, supplemental mats 730 and/or supplemental columns of mats 740 may be used for storing ECC syndrome bits and for bit replacement.

A block of steering/multiplexing logic is provided between the core block and the interface block, as well as a tag memory element 710 in the center of the interface. These elements are shown in more detail at the inset to the left of the DRAM device 700 and in FIG. 7B, described below. The tag memory 710 receives the bank address and row address when a row in the core is activated. It compares this to the row addresses needing repair, and if there is a match, the "select" output is asserted. Not all rows will need to be repaired. The tag memory 710 provides a means to selectively enable repair for those rows containing weak memory cells.

Figure 7B:
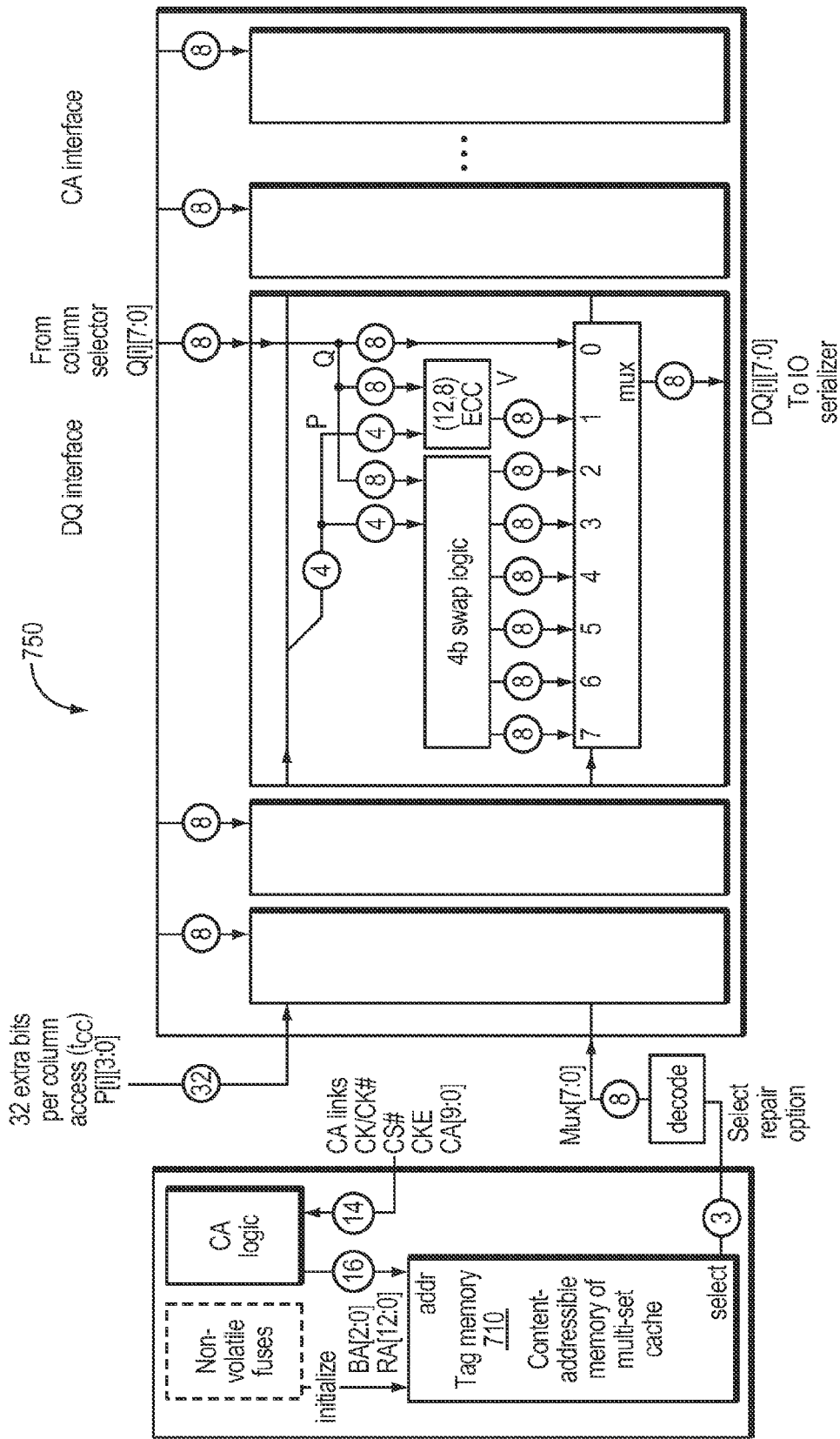
FIG. 7B is a block diagram of control circuitry for repairing memory segments for read operations.

FIG. 7B is a block diagram of control circuitry 750 for repairing memory segments for read operations. A row contains 16 k memory cells (256 columns of 64 memory cells). If a row is to be repaired, an additional 8 k memory cells (256 columns of 32 memory cells) is made available from the extra horizontal group of mat blocks. This extra horizontal group can repair 512 rows in the example DRAM. If more repair resources are needed, more repair mats can be added.

A column read operation accesses 64 bits (Q[i][7:0]) from a particular row of a particular bank. If this read operation is to a row which needs repair, an extra 32 bits (P[i][3:0]) will be accessed from the extra horizontal group. The extra 32 bits can be used to correct for weak cells in several different ways, such as through the configurations described above with reference to FIGS. 1-6. This correction may be controlled by the 8:1 multiplexer. The multiplexer select option is driven from the tag memory. Detail is shown for one of the eight identical slices (i={0, 1, . . . 7}), where each slice may operate independently to repair and correct cells.

Figure 7C:
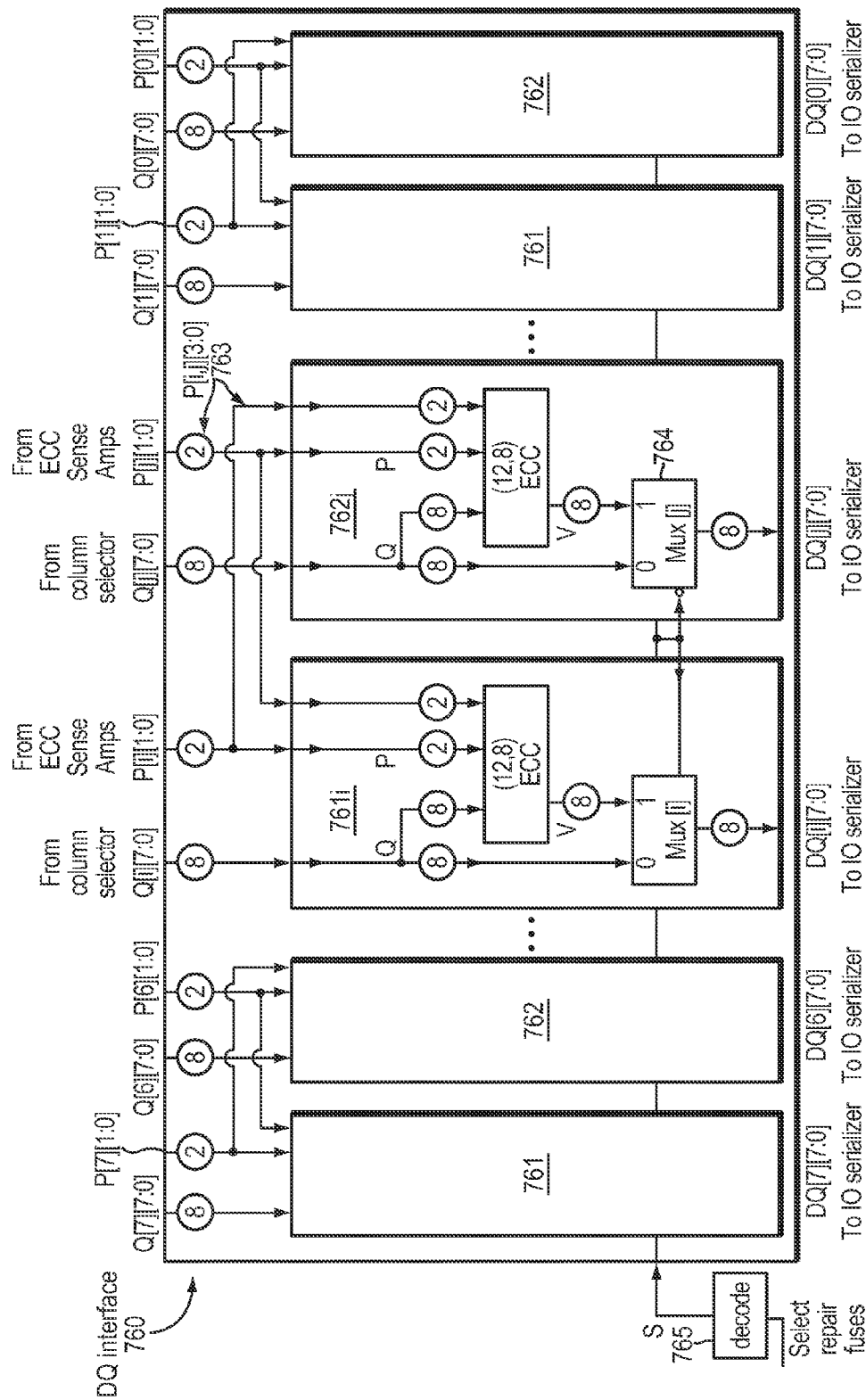
FIG. 7C is a block diagram of alternate control circuitry for repairing memory segments for read operations.

FIG. 7C is a block diagram of DQ interface 760 in a DRAM with selective ECC capability. Interface 760 may be located near SA Stripe 16 for repairing memory segments with ECC or by replacing rows or portions of rows containing defective bits. Contained within 760 are pairs of control blocks (e.g. 761, 762), connected by the column selectors to their respective data word in the bank and ECC parity bits from SA Stripe 16.

In the embodiment shown in FIG. 7C, a column read operation accesses 64 bits (eight data bytes of Q[n][7:0]) from a particular row of a particular bank. If this read operation is to a row containing defective bits, 16 bits of ECC parity will also be accessed from SA Stripe 16. The extra 16 bits can be steered to the ECC logic as shown in 761i and 762j. The selective ECC repair for an 8b data word utilizes the four parity bits (P[i,j][3:0]) and activates the correct mux [i or j] in response to the output S of the select repair fuse decoder 765. The select repair fuse decoder output specifies if the 16 bits of parity data are to be applied to all the even data bytes (Q[0][7:0], Q[2][7:0], Q[4][7:0], and Q[6][7:0]) or to all the odd data bytes (Q[1][7:0], Q[3][7:0], Q[5][7:0], and Q[7][7:0]).

If, as an example, the parity bits are to be applied to all the odd data bytes, parity bits P[i,j][3:0] 763 are applied to the (12,8) ECC logic of 761i and 762j, where i is an even number and j is an odd number. Inversion of the applied S state in 762j (764) ensures that the corrected data (V) is passed from the (12,8) ECC logic through input 1 of mux [j] to the associated IO Serializer for DQ[j][7:0]. The Q[i][7:0] data not needing correction is passed directly from the column selector through input 0 of the associated mux[i] to the associated IO Serializer DQ[i][7:0].

Figure 8A:
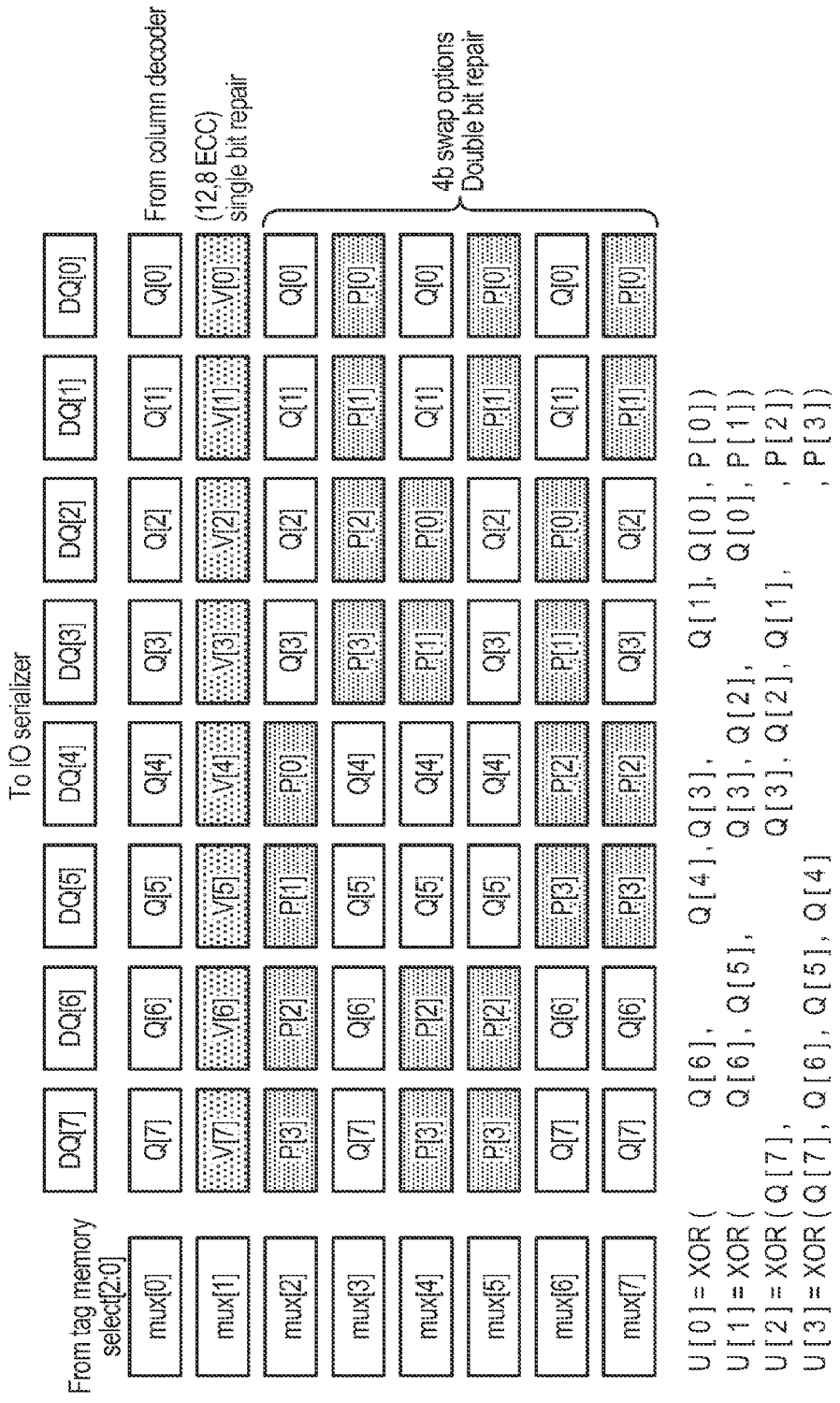
FIG. 8A is a logic table implemented by the control circuitry of FIG. 7B.

FIG. 8A is a logic table ("swap logic") implemented by the control circuitry of FIG. 7B. The table summarizes how the (Q[i][7:0]) read data is combined with the (P[i][3:0]) extra read data to give the (DQ[i][7:0]) serializer data for the eight identical slices (i={0, 1, . . . 7}). There are eight multiplexer options mux[7:0], shown in each row of the table.

The mux[0] option is used when a row does not need repair, and each Q[i][j] bit is passed directly to each DQ[i][j] bit. The mux[1] option is used when a row needs repair, and no Q[i][7:0] byte needs more than a single bit repaired. In this case, the (P[i][3:0]) extra bits are used as ECC syndrome bits. The logic equations for U[3:0] and V[7:0] show how this is done (these equations are implementing a standard (12,8) ECC decode).

The U[3:0] terms are generated by performing an exclusive-or (XOR) operation on the indicated Q[i][7:0] and P[i][3:0] bits. For example, U[0] is created by exclusive-oring Q[6], Q[4], Q[3], Q[1], Q[0], and P[0] together.

The U[3:0] terms are interpreted as a hexadecimal value (in the range of {0, 1, . . . 15}). If the U[3:0] value is equal to {12,11,10,9,7,6,5,3}, then one of the associated Q[7:0] bits is inverted to give V[7:0] which then becomes DQ[7:0]—this is a single bit correction. If the U[3:0] value is equal to {15,14,13,8,4,2,1,0}, then no correction is needed, and the Q[7:0] bits are passed to give V[7:0], which then becomes DQ[7:0].

The mux[7:2] options are provided for the case in which more than one bit in a particular slice needs to be repaired. In each of the six options, four of the Q[7:0] bits is replaced with the extra four P[3:0]. By selecting the right mux[7:2] value, any combination of a two bit error can be corrected. For example, assume that Q[7] needs to be repaired. If any of {Q[6],Q[5],Q[4]} also need to be repaired, then mux[2] will be used. If any of {Q[3],Q[2]} also need to be repaired, then mux[4] will be used. Similarly, if any of {Q[1],Q[0]} also need to be repaired, then mux[5] will be used.

By providing this flexibility on a row-by-row basis, the repair rate across the entire DRAM can be increased by a factor of 3-10×, at the cost of two additional bits in the tag entry.

Figure 8B:
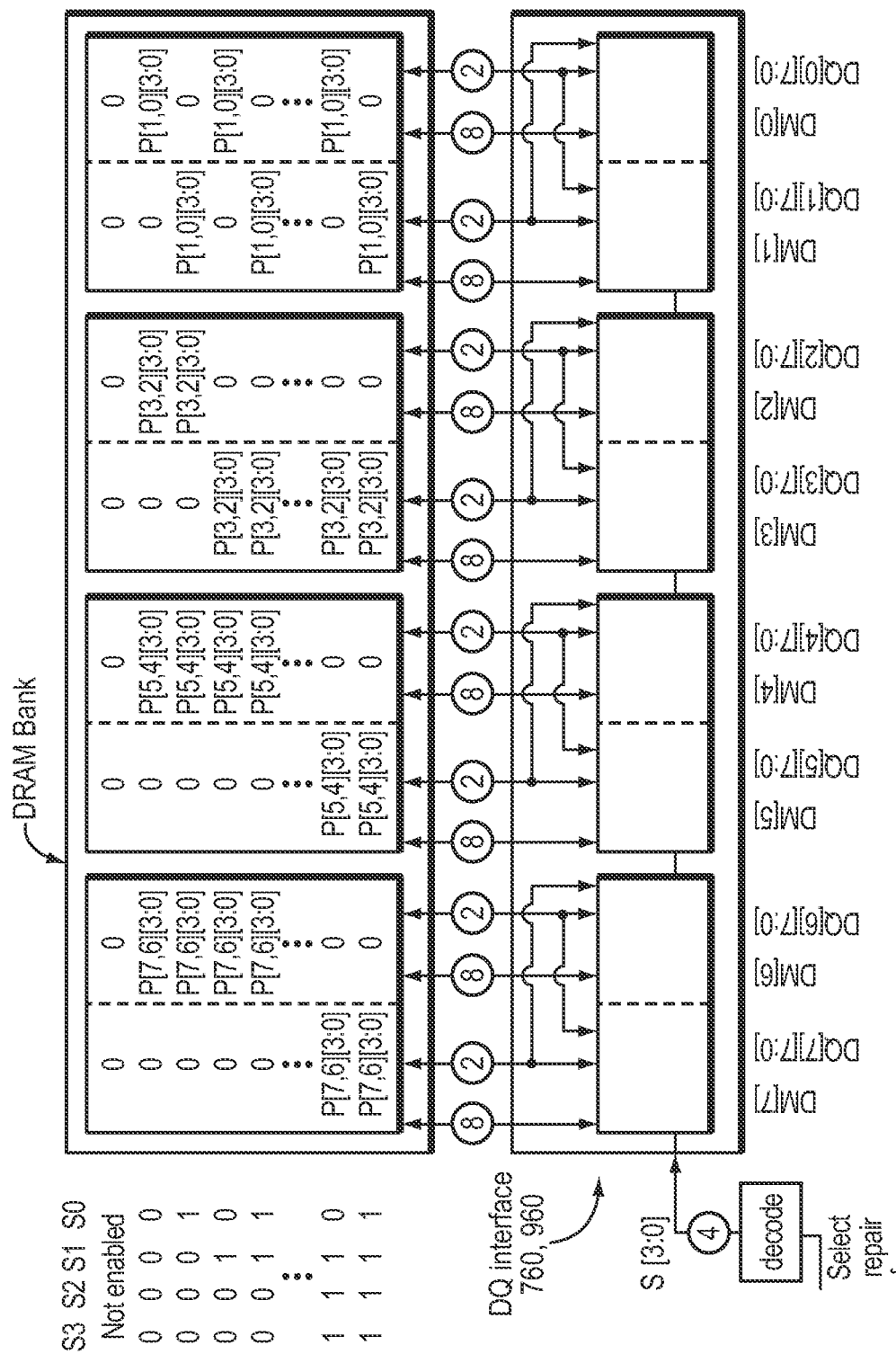
FIG. 8B is a logic table implemented by the control circuitry of FIG. 7C and FIG. 9B.

FIG. 8B illustrates another embodiment of the selective ECC repair of a DRAM Bank. In this embodiment, the 16 ECC parity bits P[I,j][3:0] may be applied to any four data bytes during a column operation. The table summarizes the mapping of ECC parity bits (P[i,j][3:0]) to the eight data bytes during a column operation. For example, if the O-bit output S[3:0] of the select repair fuse decoder is '0011', the ECC parity bits are applied to Q[1][7:0], Q[3][7:0], Q[4][7:0], and Q[6][7:0] during a read access. If the selected word line has no weak cells, the ECC logic is not enabled and the data passes directly out of the array.

Figure 9A:
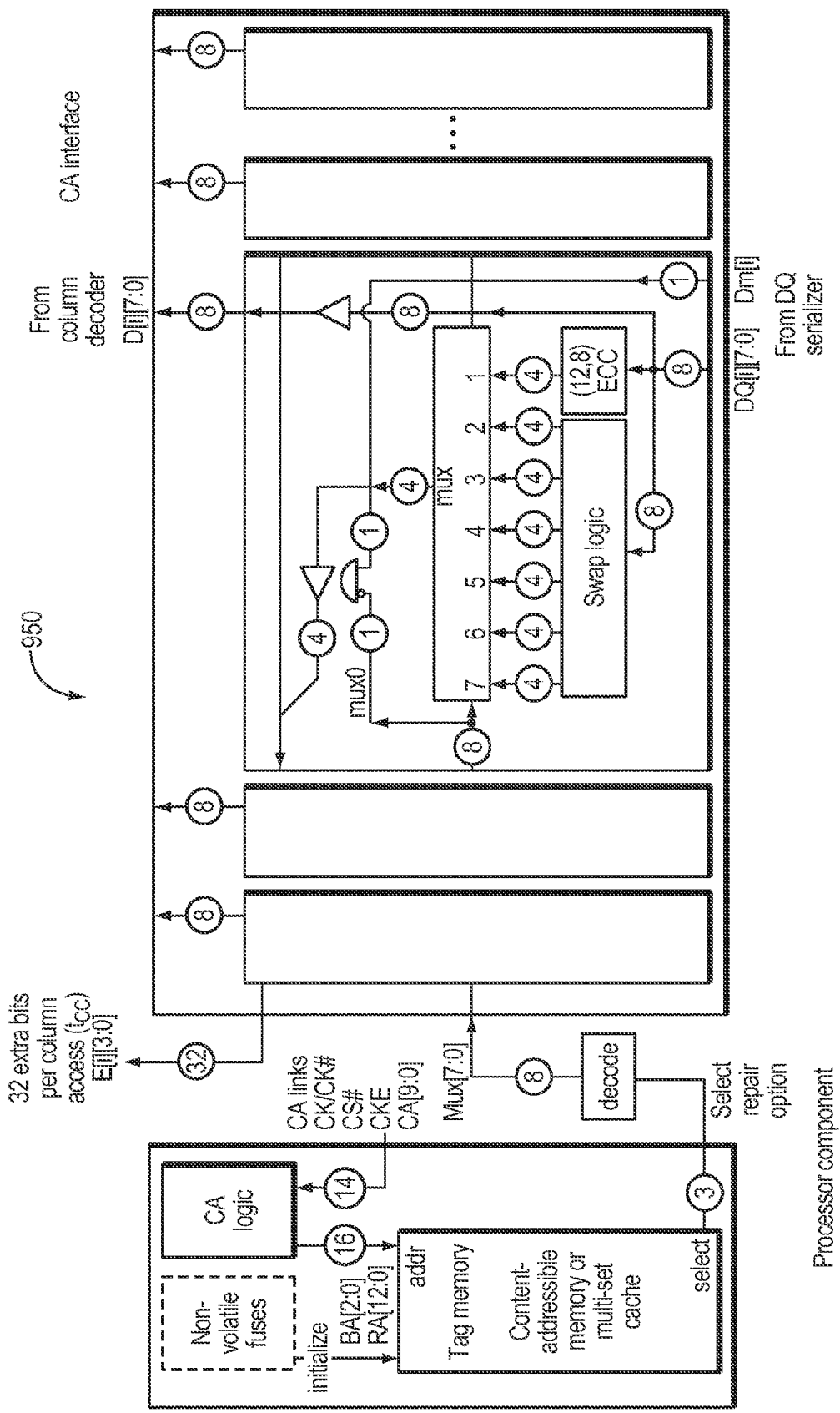
FIG. 9A is a block diagram of control circuitry for repairing memory segments for write operations.

FIG. 9A is a block diagram of control circuitry 950 for repairing memory segments for write operations. The control circuitry may be comparable to the control circuitry described above with reference to FIG. 7B, but is configured to facilitate repairs during write operations rather than read operations.

The tag memory receives the bank address and row address when a row in the core is activated. It compares this to the row addresses needing repair, and if there is a match, the "select" output is asserted. Not all rows may need to be repaired. The tag memory provides a means to selectively enable repair for those rows containing weak memory cells.

A row contains 16 k memory cells (256 columns of 64 memory cells). If a row is to be repaired, an additional 8 k memory cells (256 columns of 32 memory cells) is made available from the supplemental horizontal group of mat blocks. This extra horizontal group can repair 512 rows in the DRAM example. If more repair resources are needed, more repair mats can be added.

A column write operation stores 64 bits (D[i][7:0]) into a particular row of a particular bank. If this write operation is to a row which needs repair, an extra 32 bits (E[i][3:0]) will be stored into the extra horizontal group. The enable signal to store into the extra horizontal group is generated as the "AND" of the DM[i] signal and the NOT mux[0] signal. The DM[i] signal is the byte enable control which controls storing of the D[i] byte. The extra 32 bits can be used to correct for weak cells in several different ways, as described above. This is controlled by the 8:1 multiplexer in the bottom part of the figure. The multiplexer select option is driven from the tag memory. The figure detail is shown for one of the eight identical slices (i={0, 1, . . . 7}).

Figure 9B:
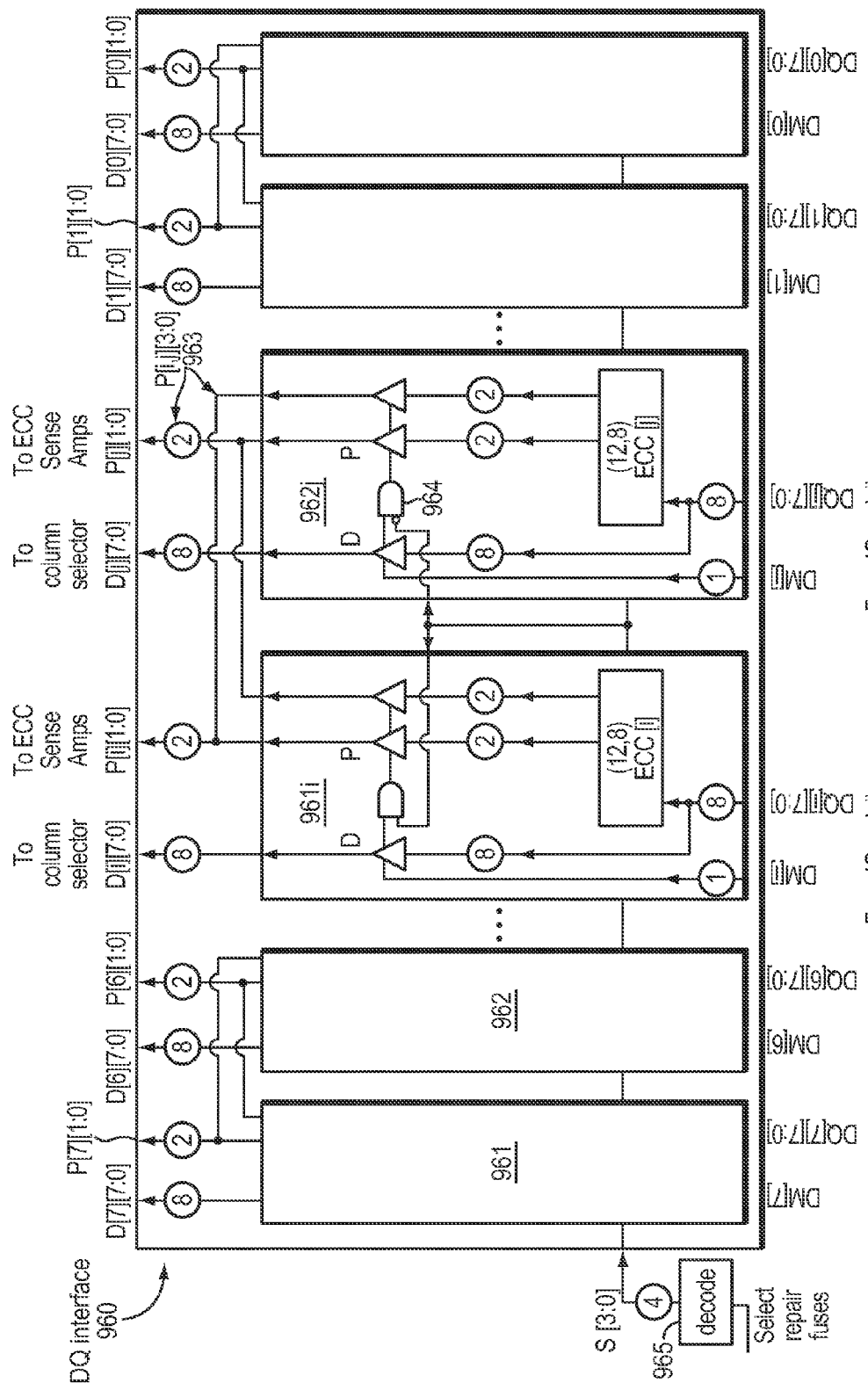
FIG. 9B is a block diagram of alternate control circuitry for repairing memory segments for write operations.

FIG. 9B is a block diagram of DQ interface 960 in a DRAM with selective ECC capability. Interface 960 includes control circuitry for repairing memory segments during write operations in the embodiment shown in FIG. 8B. A write operation to a row requires eight data bytes (assuming that data mask signals DM[7:0] are de-asserted) to be written to the array (i.e. DRAM core). For the data bytes identified by the output S[3:]0 of the select repair fuse decoder 965, the corresponding ECC parity bits are generated by the control blocks 961, 962. The ECC parity bits are steered from the ECC logic as shown in 961i and 962j. Parity bits P[i,j][3:0] are generated for either the data byte DQ[i][7:0] or DQ[j][7:0] in response to S[3:0], the correct tri-state parity buffers are activated, and the parity bits are steered to SA Stripe 16. Data masking (DM) is supported by incorporating the DM[i,j] signals in the activation of the tri-state buffers in control blocks 961, 962.

If, for example, data byte D[j][7:0] is to be protected with ECC, parity bits P[i,j][3:0] (963) are generated by the (12,8) ECC logic of 962j. The state of S[3:0] ensures that the P[i,j][3:0] generated by ECC[j] from D[j][7:0] are steered to the correct sense amplifiers in SA Stripe 16, and written to the selected T/C ECC memory cells. The D[i][7:0] data not needing ECC protection is passed directly to the array. The parity bit buffers in 961i remain tri-stated by the decode of S[3:0].

Figure 10:
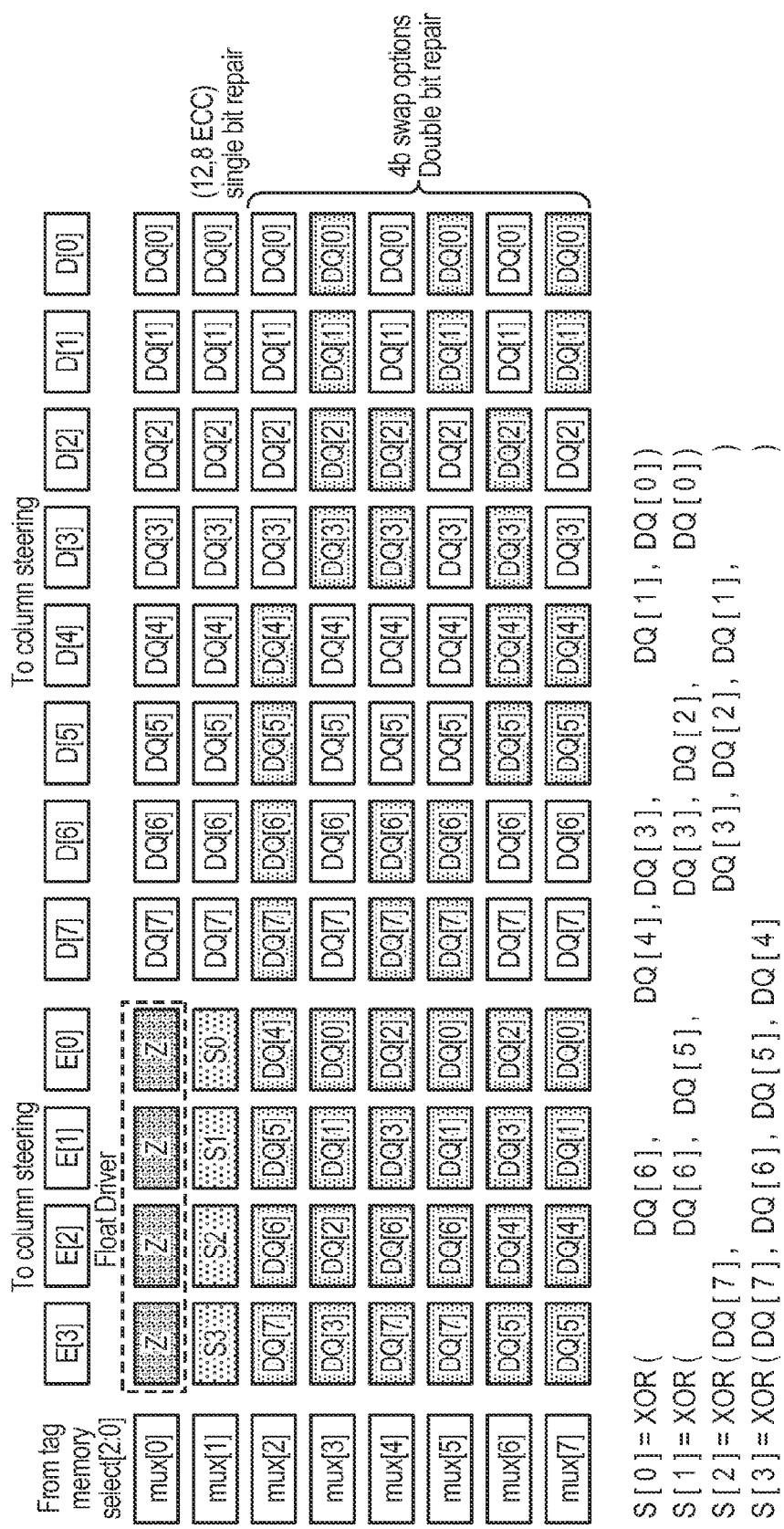
FIG. 10 is a logic table implemented by the control circuitry of FIG. 9.

FIG. 10 is a logic table implemented by the control circuitry of FIG. 9. The table summarizes how the (D[i][7:0]) write data and the (E[i][3:0]) extra write data is created from the (DQ[i][7:0]) deserializer data for the eight identical slices (i={0, 1, . . . 7}). There are eight multiplexer options mux[7:0], shown in each row of the table.

The mux[0] option is used when a row does not need repair, and each D[i][j] bit is passed directly from each DQ[i][j] bit. The (E[i][3:0]) bits are not driven ("z" means floating/tri-stated). The mux[1] option is used when a row needs repair, and no D[i][7:0] byte needs more than a single bit repaired. In this case, the (E[i][3:0]) extra bits are used as ECC syndrome bits. The logic equations for S[3:0] show how this is done (these equations are implementing a standard (12,8) ECC encode).

The S[3:0] terms are generated by performing an exclusive-or (XOR) operation on the indicated DQ[i][7:0] bits. For example, S[0] is created by exclusive-oring DQ[6], DQ[4], DQ[3], DQ[1], and DQ[0] together. The S[3:0] bits are passed to give E[3:0], and the DQ[7:0] bits are passed to give Q[7:0].

The mux[7:2] options are provided for the case in which more than one bit in a particular slice needs to be repaired. In each of the six options, four of the DQ[7:0] bits is copied to the extra four E[3:0]. By selecting the right mux[7:2] value, any combination of a two bit error can be corrected.

For example, assume that D[7] needs to be repaired. If any of {D[6],D[5],D[4]} also need to be repaired, then mux[2] will be used. If any of {D[3],D[2]} also need to be repaired, then mux[4] will be used. If any of {D[1],D[0]} also need to be repaired, then mux[5] will be used. By providing such flexibility on a row-by-row basis, the repair rate across the entire DRAM can be increased by a factor of 3-10×, at the cost of two additional bits in the tag entry.

Figure 11:
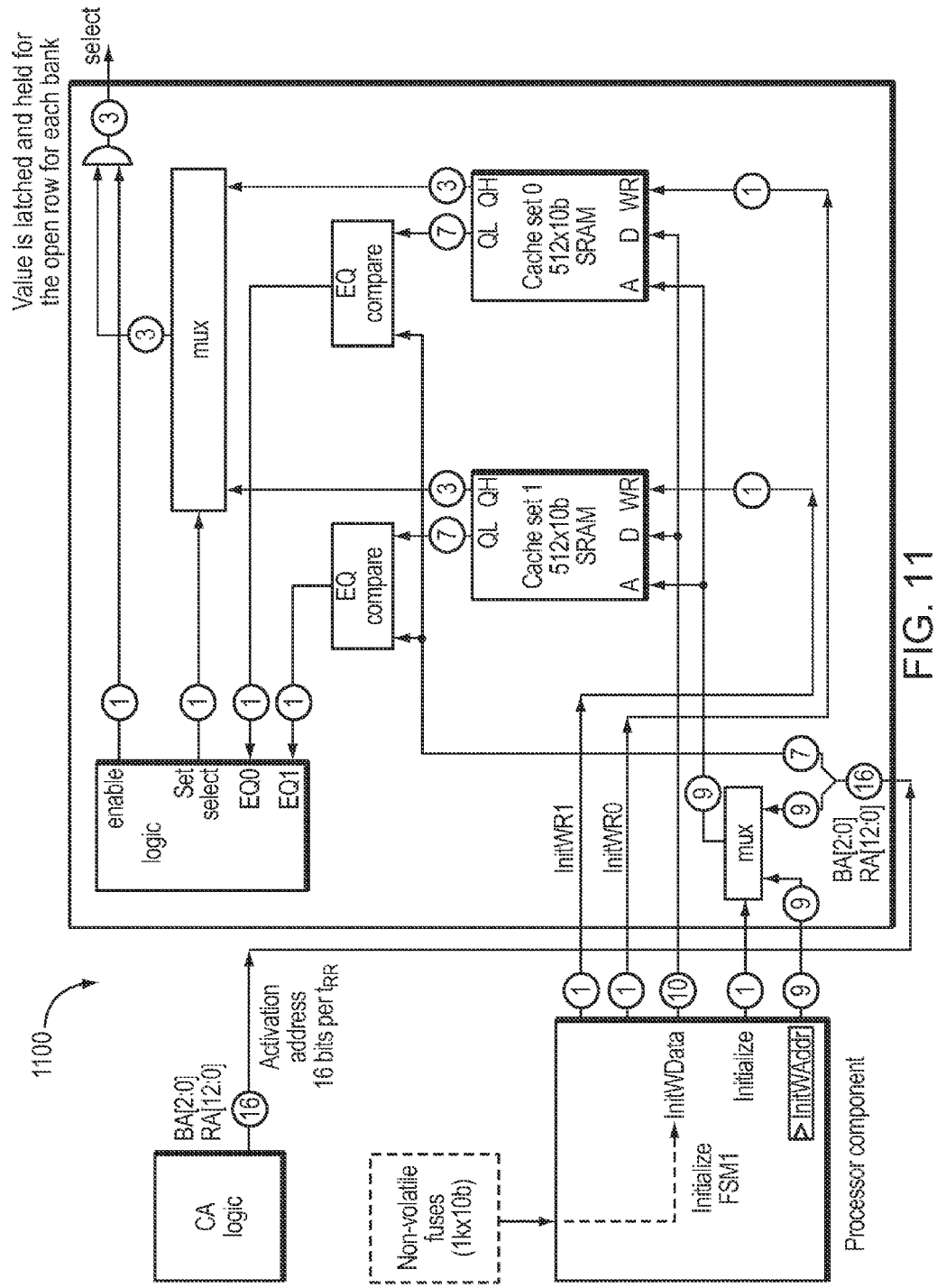
FIG. 11 is a block diagram of a tag memory logic circuit.

FIG. 11 is a block diagram of a tag memory logic circuit 1100, which determines when repair elements are enabled. The tag memory logic 1100 receives the bank address (BA [2:0]) and row address (RA[12:0]) when a row in the core is activated. This combined address is broken into two fields. One field (9 bits) is used to directly address the two cache sets. The second field (7 bits) is compared to see if it matches the value held in either of the two sets. Note that this tag memory example assumes that each of the eight banks contains 32 horizontal groups of 64 mat blocks, not 16 horizontal groups as in FIG. 1.

If either of the output values (7 bits) matches the second field (7 bits), the EQ output of one of the compare blocks will be asserted. The "logic" block will place an appropriate logic value on the "Set Select" line to enable the multiplexer to steer the three bit field from the output of the matching cache set to the "select" output of the tag memory logic. This three bit field determines which of the eight options in FIGS. 8 and 10 is used to repair the row.

If neither of the output values (7 bits) matches the second field (7 bits), the EQ output of both of the compare blocks will be de-asserted. The "logic" block will disable the AND gate which drives the "select" output of the tag memory logic, resulting in the three bit "select" field of all zeros. Consequently, this three bit field will select the mux[0] option in FIGS. 8 and 10 (no repair).

The above steps will take place each time the DRAM receives a bank address (BA[2:0]) and row address (RA[12:0]) indicating a row in the core is to be activated. The cache sets are accessed and their outputs are compared in parallel with the loading of the sense amplifiers in the selected mats. The select output will be stable when column accesses are performed on the activated row.

The 7-bit and 3-bit fields in each of the two 512 entry cache sets are loaded when the DRAM is initially powered up. There are non-volatile fuses (or their equivalent) holding 10 kb of repair information for the DRAM. This information may be gathered at a testing step during DRAM manufacture and loaded into this non-volatile storage. Alternatively, the non-volatile fuses may implement the cache sets and be directly accessed during each row activation to access the 3-bit select code. A state machine (FSM) is enabled during power-up initialization, and it transfers the information into the two cache sets by asserting the "Initialize", "InitWR0", and InitWR1" control signals and stepping through the "Init-WAddr" address values.

An alternative embodiment could use a single cache set, or more than two cache sets, or could use a fully associative organization, or some other arrangement. The depth of the cache sets could also be different than the 512 locations used in this example.

An alternative embodiment could organize the non-volatile storage as cache sets, and read them directly during each row activation. This would avoid the cost of the area of the SRAM arrays in the example, but would require that the non-volatile storage have an access time approximately comparable to the DRAM row access.

Figure 12:
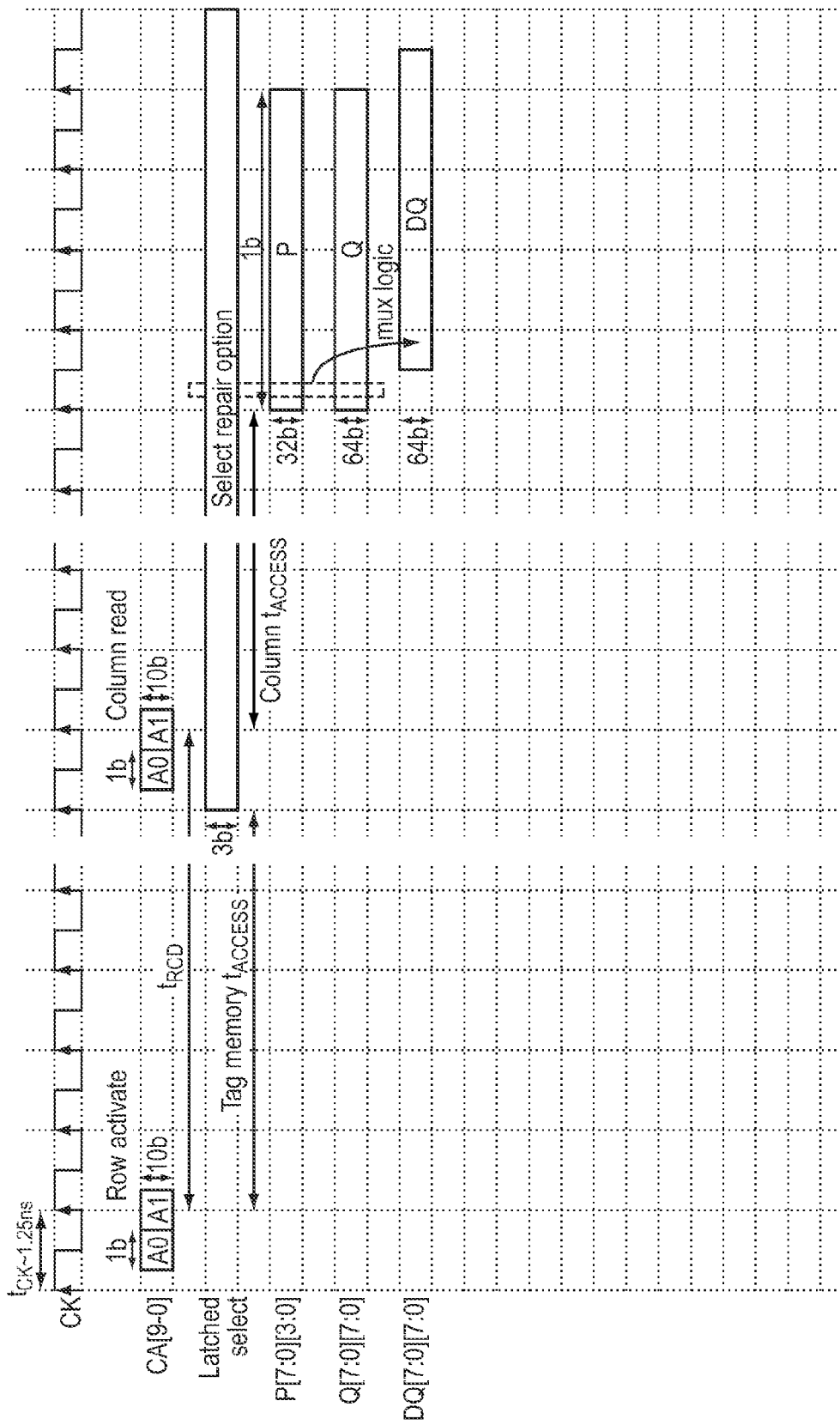
FIG. 12 is a timing diagram of a read transaction in one embodiment.

FIG. 12 is a timing diagram of a read transaction in one embodiment. A clock signal CK is shown in the top waveform. It has a frequency of 800 MHz (a 1.25 ns cycle time). The CA[9:0] control/command/address signals are shown in the second waveform. This example shows each CA link transferring two bits in each clock cycle. A DRAM command consisting of 20 bits is transferred in each clock cycle. A command will cause a row operation (like a row activation) or a column operation (like a read access) to take place.

The first command "Row Activation" transfers a command opcode, a bank address (BA) and a row address (RA) to the DRAM. The selected row of the selected bank is loaded and held in sense amplifiers. The column locations in this activated row in the sense amplifiers can be accessed after an interval of $t_{RCD}$.

The tag memory logic receives the bank address (BA) and row address (RA) when a row in the core is activated. It determines a 3-bit value "select" for that row, indicating whether it is to be repaired or not. The select value is available after an interval of $t_{ACCESS}$.

The second command "Column Read" transfers a command opcode, a bank address (BA) and a column address (CA) to the DRAM. The selected column in the activated row of the selected bank is accessed and made available on the Q[7:0][7:0] wires. The extra column bits are available on the P[7:0][3:0] wires at the same time.

Note that there will be an extra horizontal group of 64 mats for each bank, so the row and column timing of the P[7:0][3:0] bits is identical to the Q[7:0][7:0] bits. Typically, a group of mats can be built from the "dummy" memory cells available at the top and bottom edge of each bank. The details of this are described elsewhere in this application.

The value on the P[7:0][3:0] wires will be ignored if the accessed row does not require repair (i.e. "select" is 000). If it does require repair, the "select" value will indicate a non zero value {001, 010, ... 111} and will select one of the rows from the tables in FIGS. 8 and 10. The result DQ[7:0][7:0] may be transferred to a serializer in an associated interface, such as the interface described above with reference to FIG. 7A.

Figure 13:
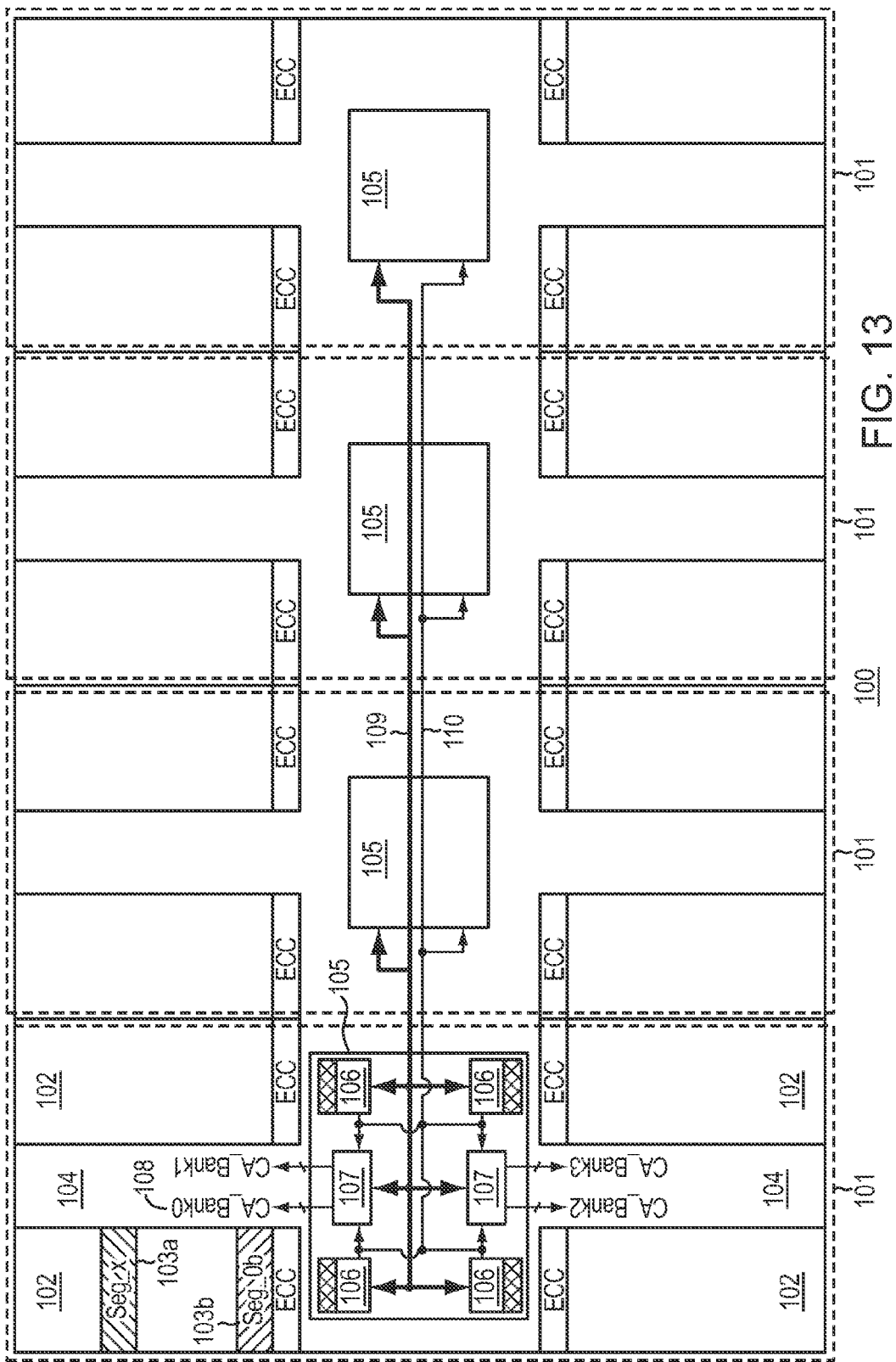
FIG. 13 is a block diagram illustrating the storage and use of addresses of defective rows in one embodiment.

FIG. 13 illustrates another embodiment of a DRAM device. The DRAM (100) consists of four bank groups (101). Each bank group contains by example, four banks including ECC memory cells (102). Each of the banks (102) is independently controlled from the local bank control block (104), in response to the bank command/address signals (eg; CA_Bank0 108). Each bank further includes a plurality of independently addressed segments (103a, 103b), controlled by the CA_Bank signals and 104.

The CA_Bank signals are derived from the bank group decode and buffer blocks (105), in response to the bank group and bank addresses contained in the global CA bus (109). The global CA bus (109) is decoded, latched and buffered to the target CA_Bank signals by circuit blocks 107. In a normal operation, if the state of the global CA bus corresponds to an activate operation, one of the plurality of bank segments will be activated (103a or 103b).

Included in functional block 105 are the fuse state latches and address comparators (106). In this option, 106 includes the physical fuses (laser, electrical, etc.), fuse latches and comparing circuits. These circuits compare the incoming global CA bus to the encoded fuse states. A match of the global CA bus and local fuse states will activate the global match line (110). Because circuit 106 activates a global signal (110), the ECC activate address is not directly mapped to the bank group in which the 105 block and associated 106 fuse/compare circuits reside. Hence, any bank in any bank group could be repaired from any 106 fuse/compare circuit. The global match signal (110) will be decoded at the appropriate 105/107 block, by the bank group and bank addresses contained in the global CA bus. In the case of an activated ECC address, the match line will be latched and buffered by 107 to activate the target bank ECC circuit block. An alternate method may utilize match lines contained within each bank group. This would provide flexible ECC activate address mapping to any bank within the bank group.

Figure 14:
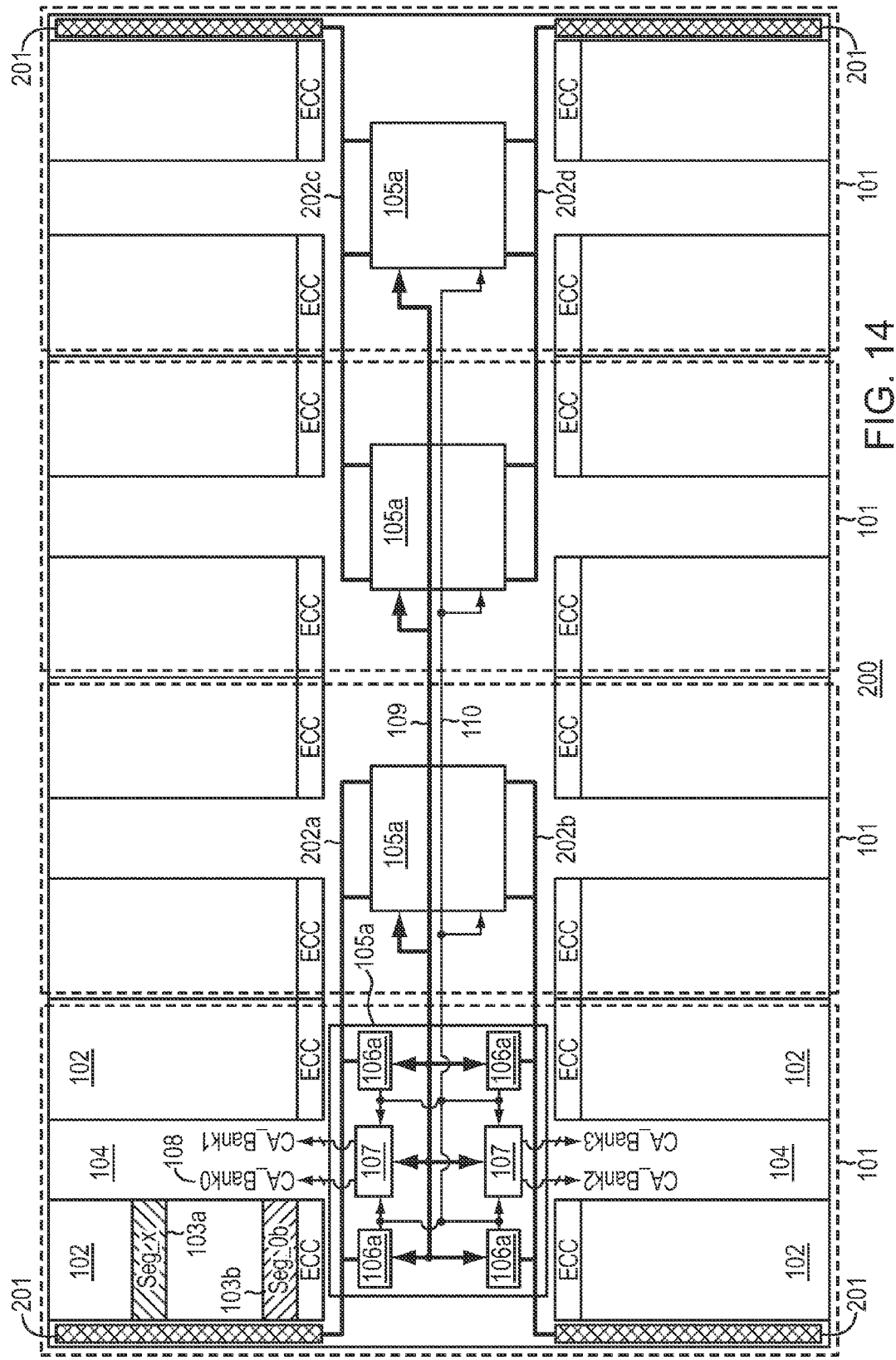
FIG. 14 is a block diagram illustrating the storage and use of addresses of defective rows in another embodiment.

FIG. 14 illustrates another embodiment of a DRAM device. The DRAM (200) shares the basic architecture features described above for FIG. 13. In this embodiment, the CA_Bank signals are also derived from the bank group decode and buffer blocks (105a), in response to the bank group and bank addresses contained in the global CA bus (109). The global CA bus (109) is decoded, latched and buffered to the target CA_Bank signals (e.g. 108) by circuit blocks 107. Included in functional block 105a are the fuse state latches and address comparators (106a). In this embodiment, the physical fuses and local registers have been moved to the chip edges (201). Hence 106a only contains fuse latches and compare circuits. The fuse states are transferred (on fuse state busses 202a, 202b, 202c, and 202d) to local fuse latches in each 105a/106a during the chip initialization. Once the fuse states are transferred and latched into their respective 105a/106a blocks, the overall operation remains the same as described above for FIG. 13.

For each option shown in FIGS. 13 and 14, the same ECC fuse to bank steering functionality is maintained. In FIG. 13, the physical fuses are integrated locally into the 106 circuit block. Because the fuses and fuse states are local, no fuse state transfer bus (202a, 202b, 202c, or 202d) is required. The chosen implementation may be driven by physical layout considerations for circuit and wiring spacing and guard rings for the fuse sets. In FIG. 14, the fuses are physically located at the chip edges, an area with low circuit density.

FIG. 15 illustrates two further embodiments (301, 302) for the operation and placement of the ECC fuse compare circuit blocks in the bank group control blocks (105, 105a). Integrated ECC fuse architecture, shown in 301, shows block 105 with 107 and two 106 blocks for clarity.

The fuse states from the integrated local fuses are loaded to the fuse latches during initialization. A Bank Activate command of the DRAM would cause the command and addresses to be driven onto the global CA bus. The comparator will drive the match line ($ML_{ECC}$) if the CA bus states match the states held in the fuse latches. For clarity, the match line is assumed to be locally contained to the bank group. The Bank group and bank addresses contained in the global CA bus will activate the target Decode+Latch block contained in 107. For example, if the global CA bus targets bank 0 in the bank group of 301, the array addresses, commands and match line will be propagated on CA_BK0 and $ML_{ECC}$_BK0.

The bank group control block (105a) for ECC fuses is located at the chip edge in the embodiment shown in 302. For this option, the physical fuses are removed from 106a and placed at the chip edges as shown in FIG. 14. The fuse states from the ECC fuses at the chip edge are loaded in to the local fuse latches in 106a, during initialization, over fuse buses 202a, 202b, 202c, and 202d. A Bank Activate command of the DRAM would cause the command and addresses to be driven onto the global CA bus. The subsequent operation and functionality would then be the same as described above for 301.

Figures 16, 16A:
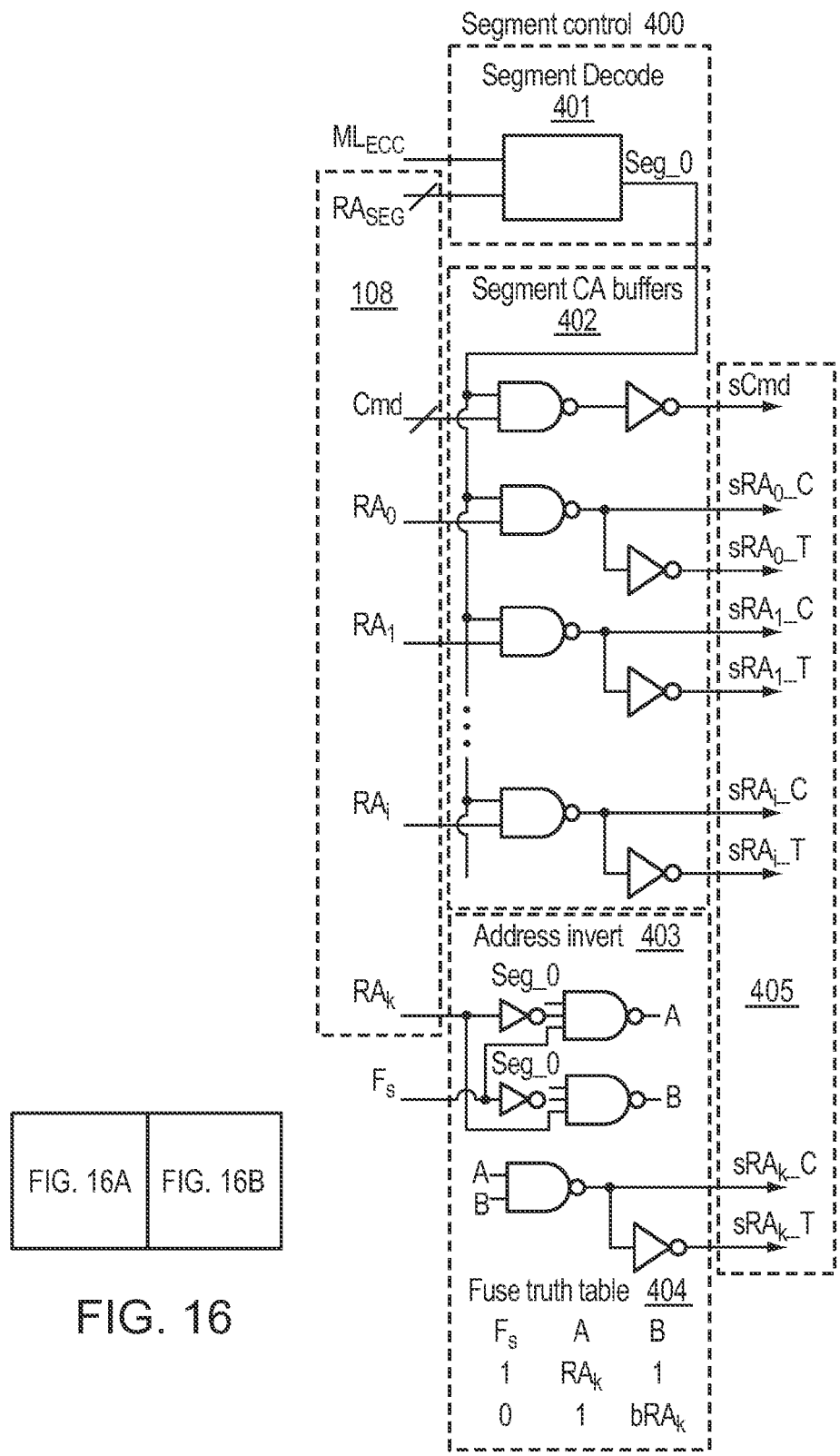
FIG. 16 is a block diagram and logic table illustrating the use of addresses of defective rows in a further embodiment.
Figure 16B:
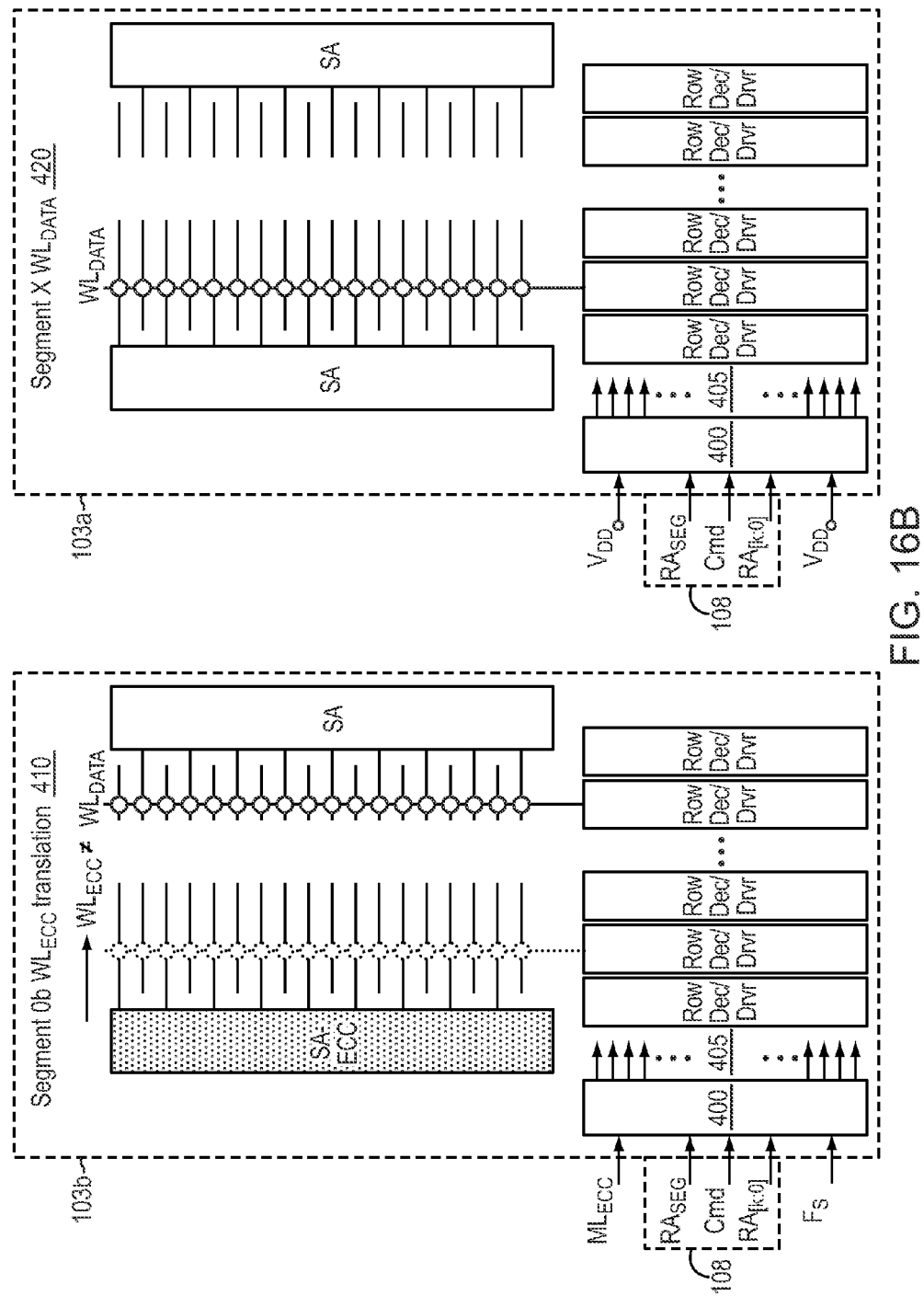

FIG. 16 illustrates the operation of the bank segments (103a, 103b) in response to the activation of the CA_Bank bus (108), which is comprised of the segment addresses ($RA_{SEG}$), commands (Cmd), and the row addresses ($RA_{[k:0]}$) for the bank. The $ML_{ECC}$ and $F_S$ inputs are connected to, and only affect, the operation of 103b. Their respective ports in 103a, containing the plurality of segments, are tied to $V_{DD}$. The segments are controlled from the segment control block (400). Included in 400 is the segment decode (401), with output Seg_0. A decode of the segment address activates the Seg_0 signal and enables the segment CA buffers (402), activating the internal segment CA bus (405) of the target array segment within the bank. In normal operation, one of the plurality of segments 103a or 103b would be activated from the state of the $RA_{SEG}$ in 108. An address match with the states encoded in the ECC fuses (106) will cause activation of the $ML_{ECC}$ input to the segment decoder (401), overriding the actual segment addresses ($RA_{SEG}$ in 108) and causing Segment 0b (103b) to be activated in parallel with the target segment in 103a. Hence the activated $WL_{ECC}$ will provide the check bits on bit lines connected to the SA-ECC, for the data provided from $WL_{DATA}$ in 103a. The other active bit lines in 103b, not be gated into the data path, are effectively refreshed.

In a first mode of operation, the activation of segment 0b in response to the $ML_{ECC}$ signal will result in address of $WL_{ECC}=WL_{DATA}$, in response to the RA[k:0] addresses in 108. A statistical probability exists in which the same RA[k:0] address may need to be repaired to two different segments, causing a conflict for the $WL_{ECC}$ resource. To accommodate this case, an address invert functional block (403) transforms one of the segment address buffers, included in the segment control (400). By use of at least one additional fuse ($F_S$) per bank, 403 will locally invert the particular $RA_k$ in segment 0b only, providing at least one $WL_{ECC}$ to be translated by the binary weight of $RA_k$, from the $WL_{DATA}$ address. Transforming two segment address buffers (eg; $RA_i$ and $RA_k$) with 403 would provide up to three translated addresses. Operation of the address invert (403) is illustrated in fuse truth table 404. The state of $F_S$ will result in the normal polarity of the 403 outputs ($F_S$=logic 1) or inversion of the output states from applied the input state ($F_S$=logic 0).

Figure 17:
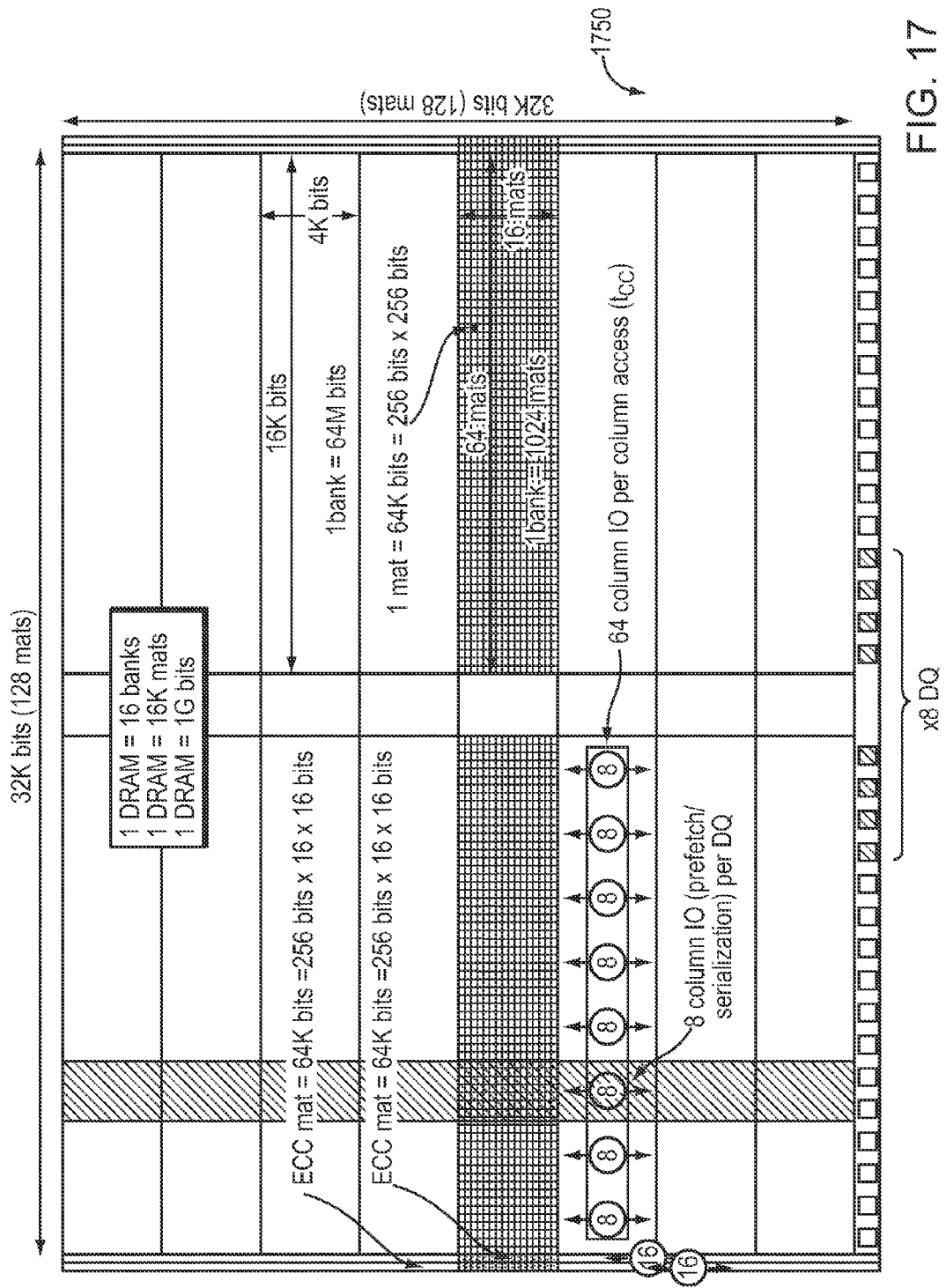
FIG. 17 shows one embodiment of this invention, wherein the ECC bits are stored in separate and dedicated mats.

FIG. 17 is a block diagram of a DRAM array 1750 in further embodiment. ECC syndrome bits can be stored in the DRAM array in multiple ways. In contrast to the embodiment described above with reference to FIG. 1A, the DRAM array 1750 includes four extra columns of mats to store the ECC bits. The ECC mats include a 256×256 array of storage cells, which, in contrast to the data mats, may be configured to facilitate ECC protection, as described below with reference to FIG. 18.

Figure 18B:
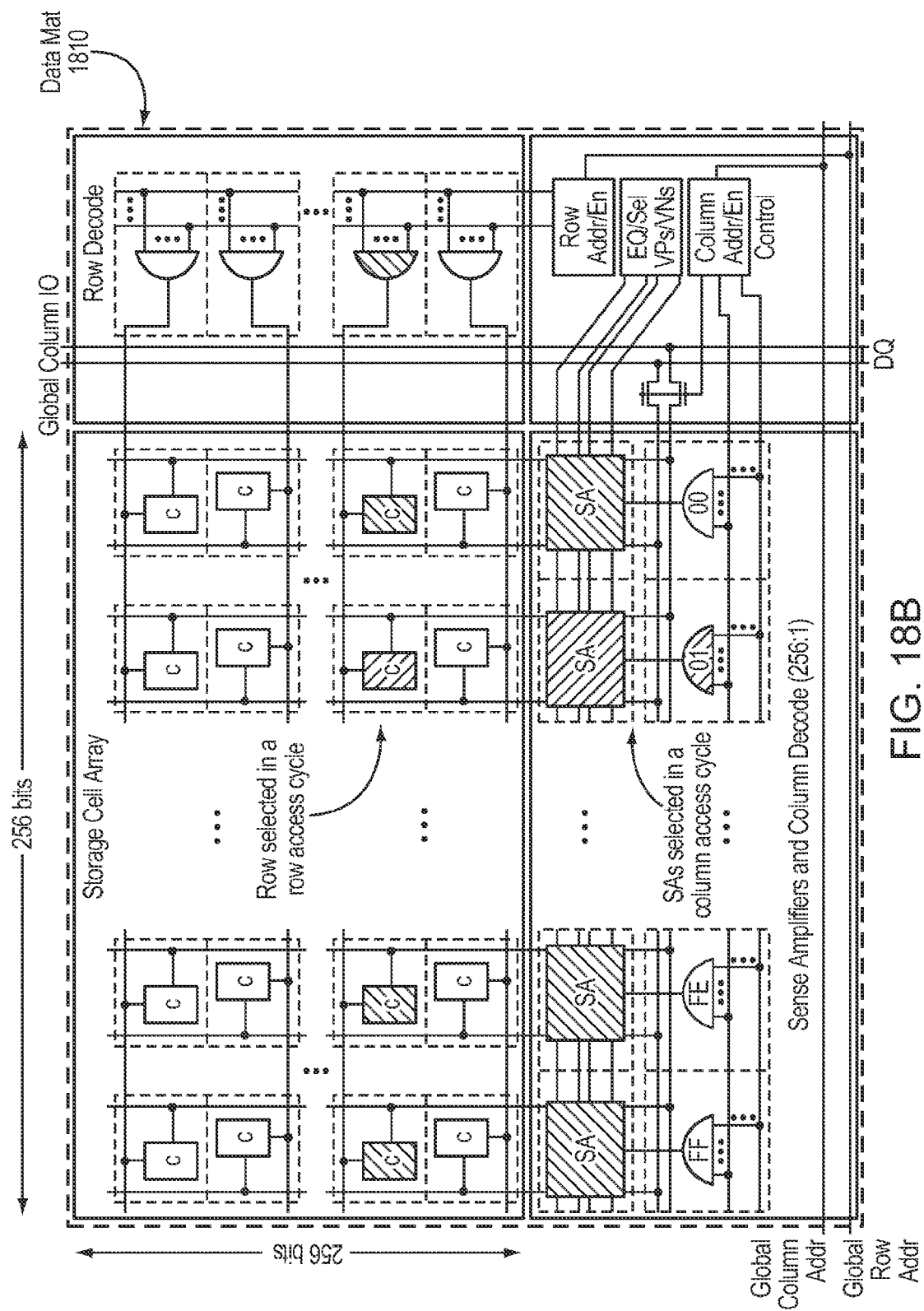
FIG. 18 shows the organization of a data mat and the organization of an ECC mat.

FIG. 18 is a circuit diagram illustrating a configuration of a data mat 1810 and an ECC mat 1820, both of which include a 256×256 array of storage cells, in one embodiment. In the data mat 1810, one of the 256 rows of storage cells is selected by the Global Row Addr signals during a row access cycle. The selected row of storage cells is highlighted in the figure. Then, during a column access cycle, one of the 256 sense amplifiers is selected by the Global Column Addr address signals. This sense amplifier is coupled to the global column IO signal passing vertically through the mat. The selected sense amplifier (and the associated storage cell) is highlighted in the figure.

In the ECC mat 1820, one of the 256 rows of storage cells is selected by the Global Row Addr signals during a row access cycle. The selected row of storage cells is highlighted in the figure. Then, during a column access cycle, 16 of the 256 sense amplifiers are selected by a portion of the Global Column Addr signals. Because 16 of 256 sense amplifiers are selected, only 4 Global Column Addr signals are required for the column decode in the ECC mat 1820. These sense amplifiers are coupled to the 16 global column IO signals passing vertically through the mat 1820.

Figure 19:
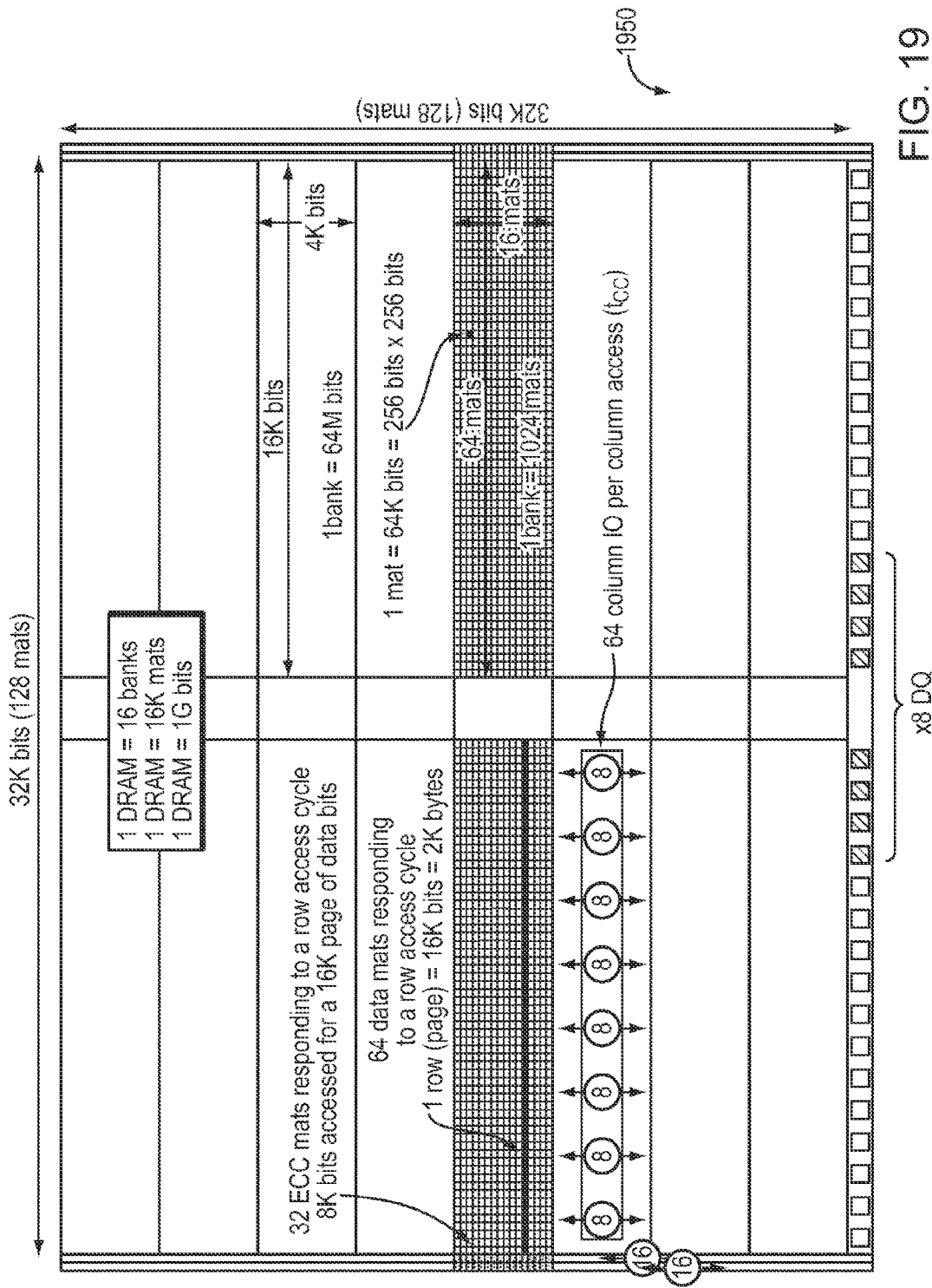
FIG. 19 shows a row access cycle to the DRAM illustrated in FIG. 3.

FIG. 19 is a block diagram of a DRAM array 1950 in further embodiment In a row access cycle, 64 data mats will each assert one of their 256 word lines such that a row of 256 storage cells in each mat is sensed by the associated sense amplifiers. FIG. 19 illustrates an example of 64 data mats responding to a row access cycle, which corresponds to a row or page size of 16K bits. With a [12, 8] ECC code, 8K ECC bits are needed to correct for single bit errors in the selected page. Since each ECC mat has 256 columns per word line, 32 ECC mats must be accessed during the row access cycle. The 32 ECC mats accessed during a row access cycle are associated with the same DRAM bank as the 64 data mats accessed during the row access cycle, as highlighted in FIG. 19.

In the column access cycle following the row access cycle, the 64 data mat cells will each couple one sense amplifier (of the 256 total) onto the 64 global column IO signals. Each data mat uses an 8-bit Global Column Addr signals to select one of the 256 sense amplifiers. In the embodiment shown in FIG. 19, 4 of the 8 bits of the Global Column Addr are used to select one of the 16 ECC mats in each ECC column associated with the bank (note that there are 2 ECC columns associated with each DRAM bank) and the other 4 bits of the Global Column Addr are used to couple 16 (of the 256 total) sense amplifiers in the selected ECC mat to the 32 global column IO signals (2 ECC mats per column of ECC mats, and 16 sense amplifiers in each ECC mat). The 64 global column IO signals carrying the data bits and the 32 global column IO signals carrying the ECC bits are connected the IO Interface Cell block (not shown in the figure). This block uses the ECC bits to check and correct the data bits before transmitting it to an external device on a read operation. In a write operation, the IO Interface Cell block receives the data bits from an external device, computes the ECC bits, and sends the data bits and the ECC bits to the DRAM array for storage.

While this invention has been particularly shown and described with references to example embodiments thereof, it will be understood by those skilled in the art that various changes in form and details may be made therein without departing from the scope of the invention encompassed by the appended claims.

What is claimed is:

1. A dynamic random access memory (DRAM) device comprising:
   a memory array having plural segments, each segment including a plurality of memory cells;
   at least one memory segment of the plural segments having a plurality of memory cells configured to store ECC information associated with the memory array; and
   control circuitry configured to select a subset of the memory array for ECC, the control circuitry linking the subset of the memory array selected to a portion of the at least one memory segment.

2. The memory device of claim 1, wherein the at least one memory segment is located at an edge of the memory array.

3. The memory device of claim 2, wherein the at least one memory segment is integral to the memory array and includes a row of memory cells at an edge of the memory array.

4. The memory device of claim 1, wherein the memory array further includes plural stripes interspersed between the plural segments, each of the plural stripes including sense amplifiers configured to detect a state of cells in segments adjacent to the stripe.

5. The memory device of claim 4, wherein the at least one memory segment is located at an edge of the memory array.

6. The memory device of claim 5, wherein the at least one memory segment is integral to the memory array and is located at an edge of the memory array.

7. The memory device of claim 6, wherein the memory array further includes at least one edge stripe located at an edge of the memory array, the at least one edge stripe including sense amplifiers configured to detect a state of cells in the at least one memory segment.

8. The memory device of claim 7, wherein the memory array further includes a plurality of load balancing capacitors connected to the at least one edge stripe opposite of the at least one memory segment.

9. The memory device of claim 1, wherein the at least one memory segment includes a first segment located at a first edge of the memory array and a second segment located at a second edge of the memory array.

10. The memory device of claim 1, wherein the control circuit is further configured to select cells for repair via bit replacement.

11. The memory device of claim 10, wherein the control circuit is further configured link a second subset of the memory array to one or more replacement cells.

12. The memory device of claim 11, wherein the control circuit is further configured to detect a fault at a cell of the cell array and tag the cell for repair via bit replacement.

13. The memory device of claim 1, wherein the control circuit is further configured to detect a cell having a low retention time and selecting the subset of the memory array for ECC protection to include the cell having the low retention time.

14. The memory device of claim 1, wherein the at least one memory segment is located at an array distinct from the memory array.

15. A method of operating a dynamic random access memory (DRAM) device, comprising:
   selecting a subset of a DRAM array for protection using error-correcting code (ECC);
   selecting a portion of a memory segment having a plurality of cells configured to store ECC information associated with the DRAM array; and
   linking the subset of the DRAM array to the portion of the memory segment such that the subset is protected by the ECC.

16. The method of claim 15, further comprising selecting memory cells for repair via bit replacement.

17. The method of claim 16, further comprising linking a second subset of the DRAM array to one or more replacement memory cells.

18. The method of claim 17, further comprising detecting a fault at a memory cell of the DRAM array and tagging the memory cell detected for repair via bit replacement.

19. The method of claim 15, further comprising detecting a memory cell having a predetermined retention time and selecting the subset of the DRAM array for ECC protection to include the cell having the predetermined retention time.

20. The method of claim 15, further comprising:
   detecting a memory cell having a fault, the memory cell being a member of the subset of the DRAM array for ECC protection; and
   selecting the memory cell for repair via bit replacement.

21. A method of operating a dynamic random access memory (DRAM) device, comprising:
   detecting a fault at at least one memory cell of a subset of a DRAM array;
   based on the fault, selecting among a bit replacement and an error-correcting code (ECC) to repair the fault at the subset of the DRAM array; and
   applying at least one of the bit replacement and the ECC correction to the subset of the DRAM array based on the selection.

22. The method of claim 21, wherein the subset of the DRAM array is a first subset of the DRAM array, and further comprising:
   detecting a fault at at least one memory cell of a second subset of a DRAM array;
   based on the fault, selecting among a bit replacement and an error-correcting code (ECC) to repair the fault at the second subset of the DRAM array; and
   applying at least one of the bit replacement and the ECC correction to the second subset of the DRAM array based on the selection.

23. The method of claim 22, wherein one of the bit replacement and ECC correction is applied to the first subset of the DRAM array, and the other of the bit replacement and ECC correction is applied to the second subset of the DRAM array.

* * * * *